(12) United States Patent
Tanaka et al.

(10) Patent No.: US 6,954,304 B2
(45) Date of Patent: Oct. 11, 2005

(54) RAMAN AMPLIFIER

(75) Inventors: Toshiki Tanaka, Kawasaki (JP); Takao Naito, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/101,839

(22) Filed: Mar. 21, 2002

(65) Prior Publication Data

US 2003/0030890 A1 Feb. 13, 2003

(30) Foreign Application Priority Data

Aug. 10, 2001 (JP) ........................................ 2001-244798

(51) Int. Cl.$^7$ ................................................ H01S 3/00
(52) U.S. Cl. ...................................................... 359/334
(58) Field of Search ........................ 359/334; 372/38.06

(56) References Cited

U.S. PATENT DOCUMENTS

| | | | |
|---|---|---|---|
| 6,417,958 B1 * | 7/2002 | Du et al. ...................... | 359/334 |
| 6,424,455 B1 * | 7/2002 | Dmitri ......................... | 359/334 |
| 6,433,921 B1 * | 8/2002 | Wu et al. ..................... | 359/334 |
| 6,445,492 B1 * | 9/2002 | Nielsen et al. ............... | 359/334 |
| 6,452,716 B1 * | 9/2002 | Park et al. .................... | 359/334 |
| 6,456,426 B1 * | 9/2002 | Bolshtyansky et al. ...... | 359/334 |
| 6,525,870 B1 * | 2/2003 | Cho et al. .................... | 359/334 |
| 6,556,341 B2 * | 4/2003 | Krummrich et al. ......... | 359/334 |
| 6,597,495 B2 * | 7/2003 | Gertsvolf et al. ......... | 359/341.3 |
| 2002/0024721 A1 * | 2/2002 | Tsuzaki et al. .............. | 359/334 |
| 2002/0054733 A1 * | 5/2002 | Kagi et al. ..................... | 385/27 |
| 2002/0075561 A1 * | 6/2002 | Krummrich ................. | 359/334 |
| 2002/0085268 A1 * | 7/2002 | Zarris et al. ................. | 359/334 |
| 2002/0105717 A1 * | 8/2002 | Krummrich .................. | 359/334 |
| 2002/0131158 A1 * | 9/2002 | Davies ......................... | 359/334 |
| 2002/0145793 A1 * | 10/2002 | Bock et al. .................. | 359/334 |
| 2002/0149842 A1 * | 10/2002 | Krummrich .................. | 359/344 |
| 2003/0002138 A1 * | 1/2003 | DeCusatis et al. .......... | 359/334 |
| 2003/0095321 A1 * | 5/2003 | Gehlot ......................... | 359/334 |
| 2003/0095322 A1 * | 5/2003 | Gehlot ......................... | 359/334 |
| 2003/0095745 A1 * | 5/2003 | Gehlot ......................... | 385/31 |

FOREIGN PATENT DOCUMENTS

| | | | |
|---|---|---|---|
| JP | 08-054511 | 2/1996 | ............ G02B/6/00 |
| JP | 11-266047 | 9/1999 | ............ H01S/3/10 |
| JP | 2001-117126 | 4/2001 | ............ G02F/1/35 |

OTHER PUBLICATIONS

P.M. Krummrich, et al., "Bandwidth Limitations of Broadband Distributed Raman Fiber Amplifiers for WDM Systems", Optical Fiber Communication Conference (OFC), Technical Digest Postconference Edition, Anaheim, CA, Mar. 17–22, 2001, Trends in Optics and Photonics Series. TOPS. vol. 54, pp. MI13–1 to MI3–3.

Shu Namiki et al., "Ultrabroad–Band Raman Amplifiers Pumped and Gain–Equalized by Wavelength–DivisionMultiplexed High–Power Laser Diodes", IEEE Journal of Selected Topics in Quantum Electronics, vol. 7, No. 1, Jan. 2001, pp. 3–16.

Communication from France Patent Office, dated Jul. 22, 2004, in corresponding French Patent Application No. 02 05354.

* cited by examiner

Primary Examiner—Nelson Moskowitz
Assistant Examiner—Deandra M. Hughes
(74) Attorney, Agent, or Firm—Staas & Halsey LLP

(57) ABSTRACT

A Raman amplifier for an optical transmission system. A light source unit generates pumping light to amplify wavelength-multiplexed signal light having a plurality of wavelengths including a wavelength band of the signal light. A transmission path propagates the signal light and the pumping light and amplifies the signal light. A pumping light supplying unit supplies the pumping light to the transmission path. A filter narrows a spread of a spectrum of the pumping light within the wavelength band of the signal light and outputs it to the pumping light supplying unit. The present invention increases transmission capacity while suppressing degradation of the transmission characteristic due to crosstalk.

18 Claims, 26 Drawing Sheets

FIG. 3

| PUMPING LIGHT WAVELENGTH(nm) | SIGNAL LIGHT WAVELENGTH(nm) |
|---|---|
| 1430 | 1530.5 |
| 1440 | 1530.8 |
| 1450 | 1531.1 |
| 1460 | 1531.4 |
| 1470 | 1531.7 |
| 1480 | 1532.0 |
| 1490 | 1532.3 |
| 1500 | 1532.6 |
| 1510 | 1532.9 |
| 1520 | 1533.2 |
| 1530 | 1533.5 |
| 1540 | 1533.8 |
|  | 1534.1 |
|  | 1534.3 |
|  | 1534.6 |
|  | 1534.9 |
|  | 1535.2 |
|  | 1535.5 |
|  | 1535.8 |
|  | 1536.1 |
|  | 1536.4 |
|  | 1536.7 |
|  | 1537.0 |
|  | 1537.3 |
| PUMPING LIGHTWAVE LENGTH |  |
|  | 1542.6 |
|  | 1542.9 |
|  | 1543.2 |
|  | 1543.5 |
|  | 1543.8 |
|  | 1544.1 |
|  | 1544.4 |
|  | 1544.7 |
|  | 1545.0 |
|  | 1545.3 |
|  | 1545.6 |
|  | 1545.9 |
|  | 1546.2 |
|  | 1546.5 |
|  | 1546.8 |
|  | 1547.1 |
|  | 1547.4 |
|  | 1547.7 |
|  | 1548.0 |
|  | 1548.3 |
|  | 1548.6 |
|  | 1548.9 |
|  | 1549.2 |
|  | 1549.5 |
|  | 1549.8 |
|  | 1550.1 |
|  | 1550.4 |
|  | 1550.7 |
|  | 1551.0 |
|  | 1551.3 |
|  | 1551.6 |
|  | 1551.9 |
|  | 1552.2 |
|  | 1552.5 |
|  | 1552.8 |
|  | 1553.1 |
|  | 1553.4 |
|  | 1553.7 |
|  | 1554.0 |
|  | 1554.3 |
|  | 1554.6 |
|  | 1554.9 |
|  | 1555.2 |
|  | 1555.5 |
|  | 1555.8 |
|  | 1556.2 |
|  | 1556.5 |
|  | 1556.8 |
|  | 1557.1 |

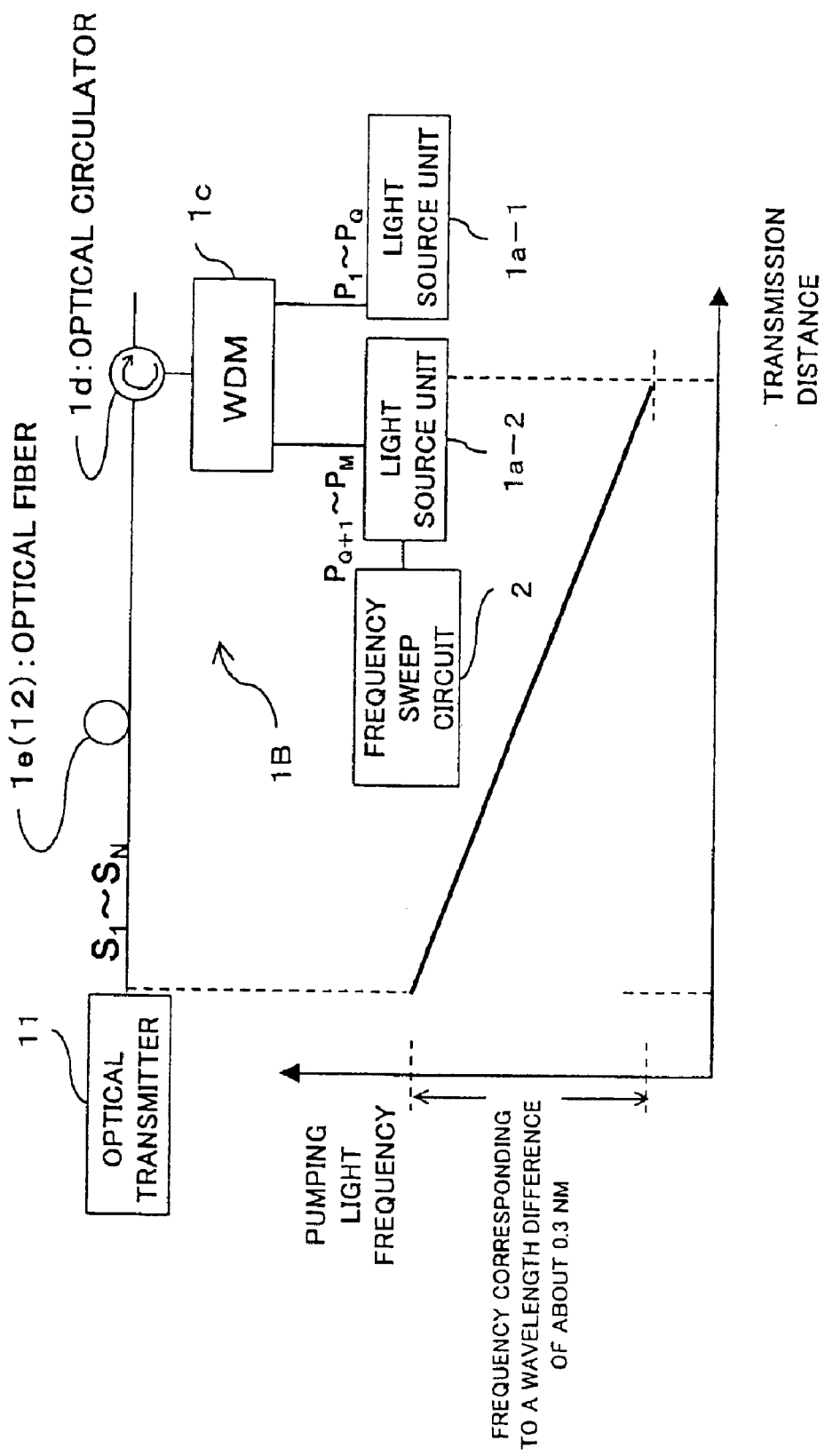

FIG. 26A

|  | COPROPAGATING PUMPING | COUNTERPROPAGATING PUMPING |
|---|---|---|
| $P_1 - P_Q$ | ○ |  |
| $P_{Q+1} - P_M$ | ○ |  |

FIG. 26B

|  | COPROPAGATING PUMPING | COUNTERPROPAGATING PUMPING |
|---|---|---|
| $P_1 - P_Q$ | ○ |  |
| $P_{Q+1} - P_M$ |  | ○ |

FIG. 26C

|  | COPROPAGATING PUMPING | COUNTERPROPAGATING PUMPING |
|---|---|---|
| $P_1 - P_Q$ |  | ○ |
| $P_{Q+1} - P_M$ | ○ |  |

FIG. 26D

|  | COPROPAGATING PUMPING | COUNTERPROPAGATING PUMPING |
|---|---|---|
| $P_1 - P_Q$ |  | ○ |
| $P_{Q+1} - P_M$ |  | ○ |

FIG. 26E

|  | COPROPAGATING PUMPING | COUNTERPROPAGATING PUMPING |
|---|---|---|
| $P_1 - P_Q$ | ○ | ○ |
| $P_{Q+1} - P_M$ | ○ |  |

FIG. 26F

|  | COPROPAGATING PUMPING | COUNTERPROPAGATING PUMPING |
|---|---|---|
| $P_1 - P_Q$ | ○ | ○ |
| $P_{Q+1} - P_M$ |  | ○ |

FIG. 26G

|  | COPROPAGATING PUMPING | COUNTERPROPAGATING PUMPING |
|---|---|---|
| $P_1 - P_Q$ | ○ |  |
| $P_{Q+1} - P_M$ | ○ | ○ |

FIG. 26H

|  | COPROPAGATING PUMPING | COUNTERPROPAGATING PUMPING |
|---|---|---|
| $P_1 - P_Q$ |  | ○ |
| $P_{Q+1} - P_M$ | ○ | ○ |

FIG. 26I

|  | COPROPAGATING PUMPING | COUNTERPROPAGATING PUMPING |
|---|---|---|
| $P_1 - P_Q$ | ○ | ○ |
| $P_{Q+1} - P_M$ | ○ | ○ |

RAMAN AMPLIFIER

BACKGROUND OF THE INVENTION

1) Field of the Invention

The present invention relates to a Raman amplifier suitable for use in an optical transmission system.

2) Description of the Related Art

In a long-distance optical transmission system, transmission is heretofore performed using an optical regenerative repeater which converts an optical signal into an electric signal, then performs retiming, reshaping and regenerating of it. An optical amplifier, which amplifies an optical signal without converting it into an electric signal and repeats the optical signal, currently comes into practice, and an optical amplification repeater transmission system using this optical amplifier as a linear repeater is under examination at present.

Namely, by replacing an optical regenerative repeater used in such an optical transmission system with an optical amplifier repeater as a linear repeater as above, it is expected that the number of parts in the repeater is largely decreased, the reliability is secured, and the cost is largely decreased.

With a recent increase in quantity of information transmitted over a network, there is a demand for a large capacity of an optical transmission system. As a method realizing a large capacity of the optical transmission system, the wavelength division multiplex (WDM: Wavelength Division Multiplex) optical transmission system, which multiplexes optical signals having not less than two different wavelengths and transmits them, attracts attention.

The WDM optical amplifier repeater transmission system, which is a combination of the WDM optical transmission system and the optical amplifier repeater transmission system, can collectively amplify optical signals having not less than two wavelengths using an optical amplifier without converting them into electric signals, which can realize a large-capacity, long-distance transmission in a simple, low-cost structure.

As a repeater of the above optical amplifier repeater transmission system, there is generally used, for example, an erbium-doped optical fiber amplifier (EDFA). A 1.55 µm band (C-band), for example, is used as a gain wavelength band of the EDFA. On the other hand, a 1.58 µm band (L-band) is used as a gain wavelength band of GS-EDFA (Gain shifted-EDFA) whose gain band is shifted to a longer wavelength. Both of EDFA and GS-EDFA have wavelength bands of not less 30 nm. It is therefore possible to realize a band of not less than 60 nm by using both the two signal optical wavelength bands by a multiplexer/demultiplexer for C-band and L-band.

In order to realize a large-capacity long-distance transmission system, increase of the signal optical wavelength band is essential. In order to realize a wide band, it is vitally examined to apply a Raman amplifier using Raman scattering as a repeater, in recent years.

Raman amplification gives pumping light to an optical fiber to provide a gain on a longer wavelength's side than a wavelength of the pumping light. Depending on a composition of an optical fiber giving pumping light, a frequency smaller by about 13.2 THz than a pumping light frequency can be a gain peak optical frequency, for example. When converted into a wavelength, the Raman gain peak wavelength is a 1.55 µm band shifted by about 100 nm from the pumping light wavelength in a 1.45 µm band.

In order to realize an amplifying function at a signal light wavelength required in Raman amplification, it is essential to set a pumping light wavelength in consideration of such a Raman shift frequency. It is alternatively possible to flatten a gain wavelength characteristic of Raman amplification using plural kinds of pumping light having different oscillation center wavelengths.

In a Raman amplifier, a pumping light power and its oscillation wavelength are adjusted to secure about 100 nm as its gain wavelength band width as disclosed in "Y. Emori, et al., '100 nm bandwidth flat gain Raman amplifiers pumped and gain-equalized by 12-wavelength-channel WDM high power laser diodes', OFC' 99, PD19, 1999."

FIGS. 19 and 20 are block diagrams showing known Raman amplifiers. A Raman amplifier 100A shown in FIG. 19 comprises a pumping source 101, a multiplexer 102A and an optical fiber 103. A Raman amplifier 100B showing in FIG. 20 comprises an optical circulator 102B along with a pumping source 101 and an optical fiber 103 similar to those of the Raman amplifier 100A shown in FIG. 19.

In each of the Raman amplifiers 100A and 100B shown in FIGS. 19 and 20, the pumping source 101 generates pumping light P1-PK having different wavelengths. The multiplexer 102A or the optical circulator 102B propagates the above pumping light P1-PK to the optical fiber 103 in the opposite direction to signal light S1-SL. The signal light S1-SL is counterpropagating-pumped by the pumping light P1-PK generated by the pumping source 101, Raman-amplified, and outputted through the multiplexer 102A or the optical circulator 102B.

The signal light S1-SL and the pumping light P1-PK in each of the Raman amplifiers 100A and 100B have a relationship in arrangement of wavelengths as shown in FIG. 21. Namely, as shown in FIG. 21, wavelengths are arranged such that a signal light wavelength band does not mix with a pumping light wavelength band.

In order to obtain a larger capacity of the transmission capacity in the Raman amplifier, it is necessary to widen the signal light wavelength band width. For this purpose, the signal light and the pumping light may be mixed within a certain band as shown in FIG. 22, for example. In the arrangement of wavelengths shown in FIG. 22, sepctra PQ+1-PM that is a part of M wavelength spectra (hereinafter simply referred as spectra, occasionally) of the pumping light P1-PM are mixedly present within a band of spectra S1-SR that are a part of spectra S1-SN of the signal light.

In the case of the arrangement in which the signal light and the pumping light are mixedly present inside a certain band, there occurs a problem that degradation of the transmission characteristic generates due to linear crosstalk or non-linear crosstalk as described below.

As denoted by PM-1 in FIG. 23, a wavelength spectrum of the pumping light P1-PM has a width 101a extending on the longer wavelength's side and the shorter wavelength's side with a center wavelength PM-1 being the center. For this, the wavelength spectrum of the pumping light is widely overlapped on wavelengths arranged as the signal light optical wavelengths inside a band 101b in which the signal light wavelengths and the pumping light wavelengths are mixedly arranged.

In this case, when Raman amplification is performed by counterpropagating pumping like the Raman amplifier 100B shown in FIG. 20, Rayleigh scattering light at a wavelength of the pumping light overlapped on the signal light propagates in the same direction as the signal light, thus becomes noise light to the signal light, which causes degradation of an optical SN ratio of the signal light due to linear crosstalk, as shown in FIG. 24. In the case of copropagating pumping, the pumping light travels in the same direction as the signal light when a band of the pumping light wavelength overlaps on a part of a band of the signal light, so that wavelengths of the signal light overlap on the pumping light wavelength. This degrades an optical SN ratio of the signal light due to linear crosstalk, as well.

The optical SN ratio of the signal light whose wavelength spectrum is overlapped by the pumping light significantly degrades due to the following non-linear crosstalk.

Namely, since a power of the pumping light is extremely large, four-wave mixing occurs between the signal light and the pumping light, and in the pumping light. In concrete, since the pumping light of Raman amplification is extremely larger than the signal light, four-wave mixing occurs between the signal light and the pumping light, which causes a transmission characteristic due to the following non-linear crosstalk.

Four-wave mixing is light newly generating due to mixing of optical frequencies, which satisfies the following conditional equation (1) or (2) (refer to FIG. 25):

$$f4=f2+f3-f1 \quad (1)$$

$$f4=2f3-f2 \quad (2)$$

wherein, f4 is a frequency of four-wave mixing light newly generating, and f1, f2 and f3 are frequencies of existing light. When f2 is arranged at the signal light and a wavelength f3 has a pumping light component, for example, new light at a wavelength f4 obtained by the equation (2) generates. When the signal light is arranged at the wavelength f4, degradation of the transmission characteristic of the signal light occurs.

As cited above an existing optical power threshold value when the four-wave mixing light generates is extremely low. Namely, it can be considered that the above four-wave mixing generates due to an optical power of a pumping light component away from the center wavelength. When a beat noise caused by the four-wave mixing light newly generating due to such the four-wave mixing and the existing signal light enter into a baseband of the optical receiver, degradation of the transmission characteristic much larger than the power crosstalk occurs, which becomes a factor of limitation exerting a large effect on the WDM transmission.

SUMMARY OF THE INVENTION

In the light of the above problem, an object of the present invention is to suppress degradation of the transmission characteristic due to linear crosstalk and non-linear crosstalk while aiming a large capacity of the transmission capacity in an arrangement in which the signal light and the pumping light are mixedly present within a certain band.

The present invention therefore provides a Raman amplifier amplifying wavelength-multiplexed signal light obtained by wavelength-multiplexing plural kinds of signal light having information, comprising a light source unit for generating pumping light for amplifying the wavelength-multiplexed signal light, in which a plurality of wavelengths including a wavelength band of the wavelength-multiplexed signal light are arranged, a transmission path for propagating the wavelength-multiplexed signal light and pumping light from the light source unit, and amplifying the wavelength-multiplexed signal light, a pumping light supplying means for supplying the pumping light to the transmission path; and a filter means for narrowing a spread of a spectrum of the pumping light, generated by the light source unit, the pumping light being arranged inside the wavelength band of the wavelength-multiplexed signal light, and outputting the pumping light to the pumping light supplying means.

In the above Raman amplifier, the light source unit may comprise a first pumping source for generating first pumping light, a wavelength thereof being arranged inside a wavelength band of the wavelength-multiplexed signal light, and outputting the first pumping light to the filter means, and a second pumping source for generating second pumping light, a wavelength thereof being arranged outside the wavelength band of the wavelength-multiplexed signal light, whereas the pumping light supplying means may comprise a multiplexer for multiplexing the first pumping light, a spread of a spectrum of which has been narrowed by the filter means, and the second pumping light from the second pumping source, and a first optical means for supplying pumping light multiplexed by the multiplexer as counterpropagating pumping light to the transmission path.

The light source unit may comprise a first pumping source for generating first pumping light, a wavelength thereof being arranged inside a wavelength band of the wavelength-multiplexed signal light, and outputting the first pumping light to the filter means, and a second pumping source for generating second pumping light, a wavelength thereof being arranged outside the wavelength band of the wavelength-multiplexed signal light, whereas the pumping light supplying means may comprise a second optical means for mutliplexing the first pumping light, a spread of a spectrum of which has been narrowed by the filter means, as copropagating pumping light and the wavelength-multiplexed signal light, and a third optical means for supplying the second pumping light generated by the second pumping source as counterpropagating pumping light to the transmission path.

The optical filter means may narrow a spread of a spectrum of the pumping light to the same degree as a spectrum of each kind of the signal light.

The optical filter means may be configured with optical filters arranged in series in directions so that polarization dependency thereof is cancelled. A plurality of wavelengths of the pumping light may be periodically arranged inside a wavelength band of the wavelength-multiplexed signal light, and the optical filter means may have a periodic filter characteristic corresponding to spacing in a wavelength arrangement of the pumping light.

A second Raman amplifier according to this invention amplifying wavelength-multiplexed signal light obtained by multiplexing plural kinds of signal light having information comprises a light source unit for generating pumping light for amplifying the wavelength-multiplexed signal light, in which a plurality of wavelengths including a wavelength band of the wavelength-multiplexed signal light are arranged, a pumping light supplying means for supplying the pumping light to a transmission path, the transmission path for propagating the wavelength-multiplexed signal light and pumping light from the pumping light supplying means, and amplifying the wavelength-multiplexed signal light, and a variable controlling means for variably controlling a wavelength of pumping light generated by the light source unit.

In the above second Raman amplifier, the variable controlling means may perform a sweep control or a modulation control on a wavelength of the pumping light. In which case, a frequency used to sweep or modulate the pumping light by the variable controlling means may be set smaller than mode spacing of the pumping light.

In the above first or second Raman amplifier, a plurality of wavelengths of the pumping light may be arranged inside a wavelength band of the wavelength-multiplexed signal light, and a plurality of wavelengths of the same may be arranged outside the wavelength band of the wavelength-multiplexed signal light.

According to the Raman amplifier of this invention, the filter means can narrow a width of each wavelength spectrum of the pumping light to diminish overlapping of wavelengths of the signal light component and the pumping light component in an arrangement in which the signal light and the pumping light are mixedly present in a certain band. It is therefore possible to suppress degradation of an optical SN ratio of the signal light due to linear crosstalk and non-linear crosstalk, to thus suppress degradation of the transmission capacity transmission characteristic.

The variable controlling means can suppress generation of four-wave mixing light at the same wavelength. It is therefore possible to suppress degradation of the waveform due to four-wave mixing light, suppress degradation of the optical SN ratio, and suppress degradation of the transmission capacity transmission characteristic.

BRIEF DESCRIPTION OF THE DRAWINGS

FIG. 3 is a diagram showing an example of arrangement of wavelengths of pumping light and a part of signal light;

FIG. 11 is a diagram for illustrating a sweep control of the Raman amplifier according to the second embodiment;

FIGS. 26A through 26I are diagrams for illustrating pumping modes of a Raman amplifier according to modifications of the embodiment.

DESCRIPTION OF THE PREFERRED EMBODIMENTS

Hereinafter, description will be made of embodiments of the present invention with reference to the drawings.

(a1) Description of First Embodiment

Figure 1:
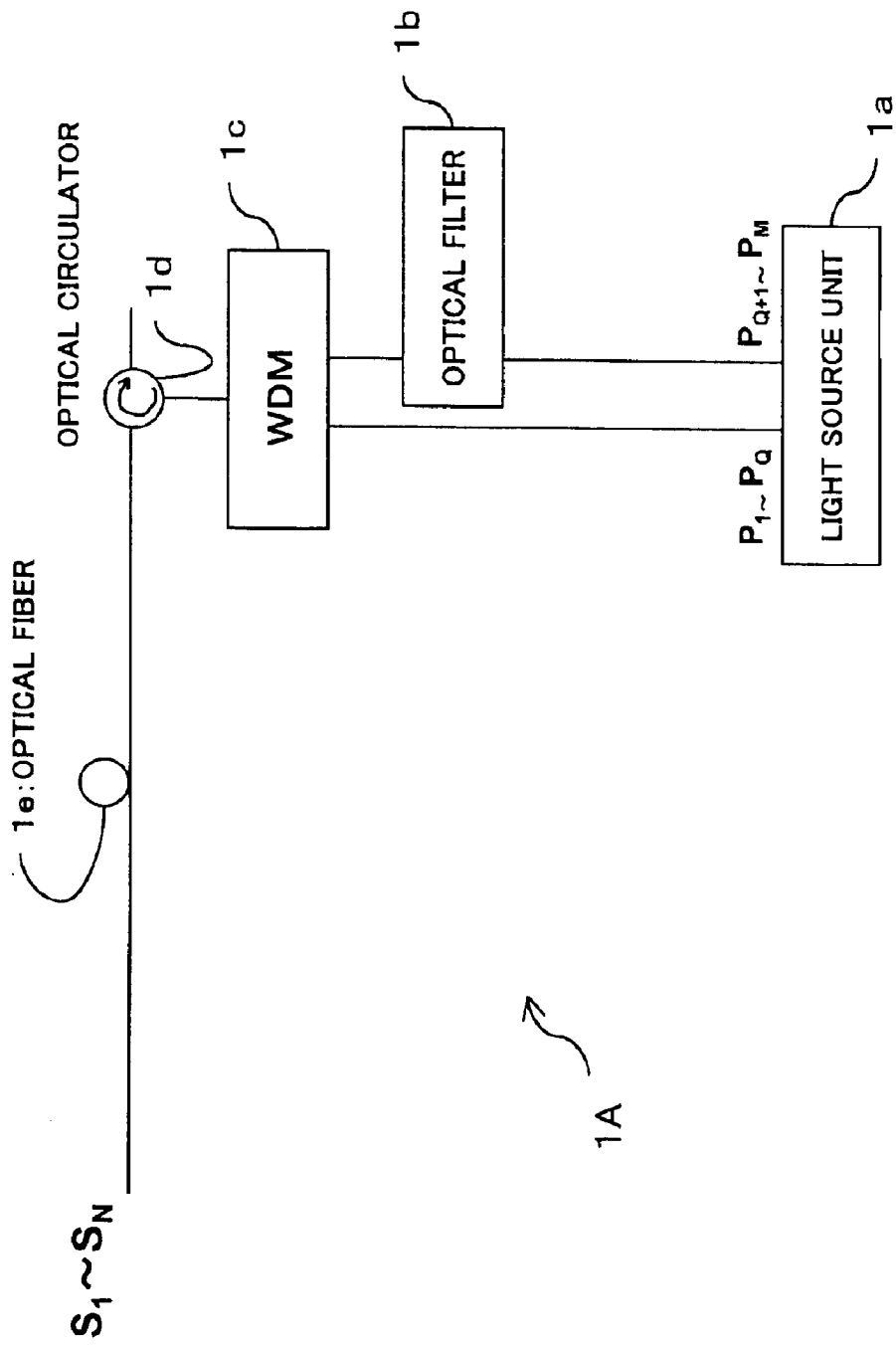
FIG. 1 is a block diagram showing a Raman amplifier according to a first embodiment of this invention.

FIG. 1 is a block diagram showing a Raman amplifier according to a first embodiment of this invention. The Raman amplifier 1A shown in FIG. 1 Raman-amplifies wavelength-multiplexed signal light obtained by wavelength-multiplexing plural kinds of signal light S1-SN having information. The Raman amplifier 1A can be used as an amplifier 11c or 13a in an optical transmitter 11 or an optical receiver 13, or an optical amplifier 12a interposed on a transmission path fiber 12 in an optical transmission system 10 shown in FIG. 2, for example.

The optical transmitter 11 in the optical transmission system 10 comprises E/O (Electric/Optic) converting units 11a-1 to 11a-n for converting plural kinds of transmission signals, which are electric signals, into optical signals, a multiplexer 11b for multiplexing (wavelength-multiplexing) the transmission optical signals from the E/O converting units 11a-1 to 11a-n and outputting them as a wavelength-multiplexed optical signal, and a Raman amplifier 11c according to this invention. The Raman amplifier 11c Raman-amplifies the wavelength-multiplexed signal light from the multiplexer 11b, and sends it to the transmission path fiber 12.

The transmission path fiber 12 connects the optical transmitter 11 to the optical receiver 13 to transmit an optical signal sent from the optical transmitter 11 to the optical receiver 13. On the transmission path fiber 12 interposed is at least one (five in FIG. 2) amplifier 12a according to this invention. The wavelength-multiplexed optical signal transmitted through the transmission path fiber 12 is repeater-amplified by the amplifier 12a, and outputted to the rear stage.

The optical receiver 13 comprises a demultiplexer 13b and O/E converting units 13c-1 to 13c-n along with a Raman amplifier 13a according to this invention, wherein a wavelength-multiplexed optical signal received and amplified by the Raman amplifier 13a is demultiplexed (wavelength-demultiplexed) by the demultiplexer 13b, and converted into electric signals by the E/O converting units 13c-1 to 13c-n.

The Raman amplifier 1A shown in FIG. 1 comprises, in detail, a light source unit 1a, an optical filter 1b, a WDM multiplexer 1c, and optical circulator 1d and an optical fiber 1e, in order to suppress degradation of transmission characteristics due to linear crosstalk and non-linear crosstalk while using pumping light in which a plurality of wavelengths including a band of a wavelength-multiplexed optical signal that is an object of amplification are arranged.

The light source unit 1a generates pumping light for amplifying the above wavelength-multiplexed signal light, in which a plurality of wavelengths are arranged, including a band of the wavelength-multiplexed signal light. The pumping light has M wavelength spectra P1-PM arranged at equal spacing (hereinafter characters P1 to PM of wavelength spectra of the pumping light will be attached to the pumping light).

A part PQ+1-PM of the pumping light P1-PM is mixedly present within a band of wavelength-multiplexed signal light S1-SN. Whereby, pumping light having wavelengths in the vicinity of PQ and signal light having wavelengths in the vicinity of S1 act as pumping light on signal light (signal light at wavelengths shifted by 100 nm to the longer wavelength's side from a wavelength in the vicinity of PQ or a wavelength in the vicinity of S1, for example) to cause Raman excitation in two stages, whereby a wide band is realized.

In other words, with regard to the pumping light, a plurality of wavelengths PQ+1-PM are arranged inside a wavelength band of the wavelength-multiplexed signal light S1-SN, and a plurality of wavelengths P1-PQ are arranged outside the wavelength band of the wavelength-multiplexed signal light S1-SN.

As an arrangement of wavelengths configuring the pumping light P1-PM, 12 (M=12) wavelengths are arranged within a band of about wavelengths 1430 nm to 1540 nm at about 10 nm spacing, as shown in, for example, FIG. 3. As an arrangement of wavelengths configuring the wavelength-multiplexed signal light, wavelengths are arranged within a band of about wavelengths 1530 nm to 1640 nm at about 0.3 nm spacing excepting a portion overlapped by the pumping light wavelength band.

As shown in FIG. 3, wavelengths of the signal light are not arranged at about 0.3 nm spacing in the portion overlapped by the pumping light wavelength band, but the wavelengths are arranged about ±2.5 nm apart from the center of a wavelength of the pumping light. In concrete, the signal light in the vicinity of 1540 nm at which a pumping light wavelength is set can be arranged at 1536.7 nm, 1537.0 nm, 1537.3 nm, 1542.6 nm, 1542.9 nm, 1543.2 nm and so on from the shorter wavelength's side.

In other words, as an arrangement of wavelengths configuring the wavelength-multiplexed signal light, wavelengths are arranged at about 0.3 nm spacing in a band shifted by about 100 nm to the longer wavelength's side from the pumping light wavelength band (wavelengths from 1430 nm to 1540 nm) excepting a portion overlapped by the pumping light wavelengths, while the wavelengths are arranged about 2.5 nm apart from the center of a wavelength at which the pumping light is arranged.

The optical filter (optical filter means) 1b is configured with, for example, a dielectric multiplayer. The optical filter 1b narrows a spread of a spectrum of a wavelength of the pumping light arranged inside a wavelength band of the wavelength-multiplexed signal light to about the same degree of spacing of each spectrum of the signal light including the wavelength-multiplexed signal light, and outputs it to the WDM multiplexer 1c in the rear stage. The optical filter 1b has a single-peak filter characteristic in a direction of wavelength where a peak of the transmission characteristic is located at the center wavelength, with respect to a spectrum of each wavelength of the pumping light PQ+1-PM.

Figure 4:
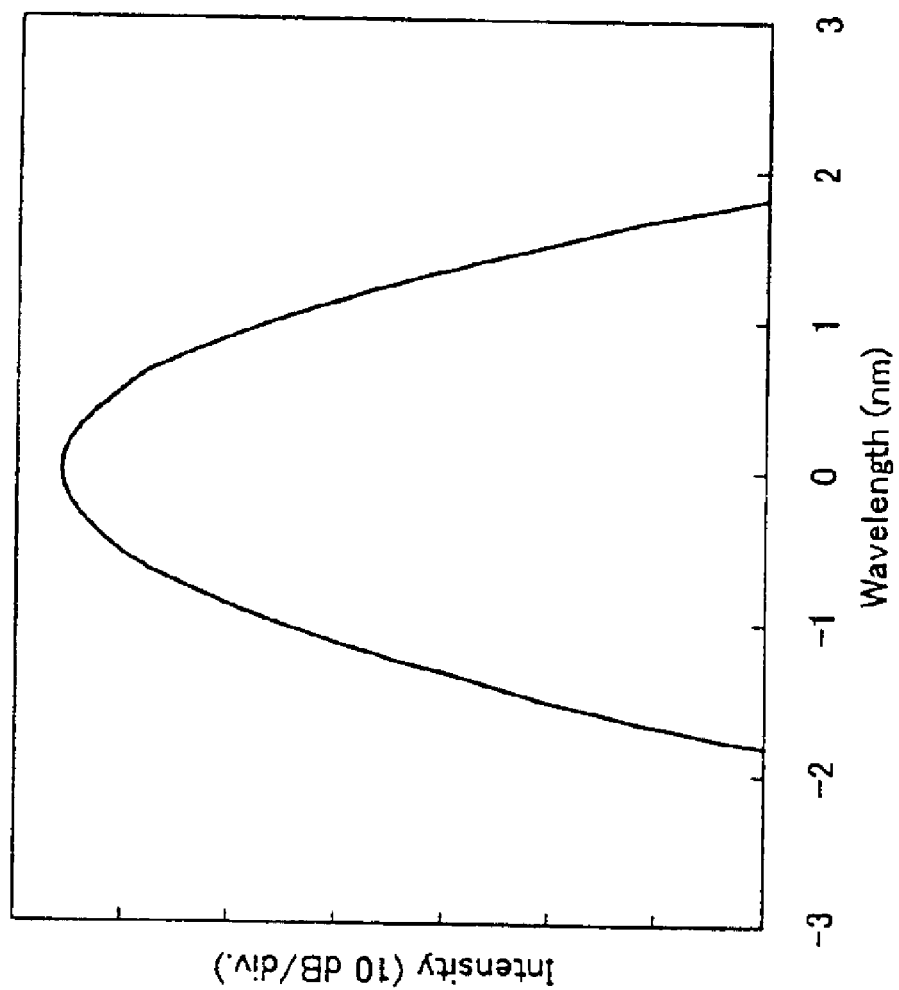
FIG. 4 is a diagram showing a characteristic of an optical filter.

In concrete, the optical filter 1b has a single-peak or periodic characteristic in the direction of wavelength, and has a characteristic that a suppression ratio thereof is about 30 dB at ±1.25 nm from the center frequency with regard to spectra of the pumping light PQ+1-PM (first pumping light), as shown in FIG. 4, thereby decreasing a width of a spectrum of the pumping light to about the same degree of spacing of spectra of the signal light. Thus, it is possible to decrease overlapping of a wavelength spectrum of the pumping light on adjacent signal light components whose center wavelengths are about ±2.5 nm apart therefrom.

Namely, by that the signal light in the vicinity of a wavelength position at which the above pumping light wavelength is located is arranged at lager spacing than those of wavelengths equally spaced, and by a function of narrowing a spread of a spectrum of the pumping light by the optical filter 1b, overlapping of the pumping light on the signal light is decreased.

The WDM multiplexer 1c multiplexes (wavelength-multiplexes) pumping light P1-PQ (second pumping light arranged outside a wavelength band of the wavelength-multiplexed signal light) from the light source unit 1a and pumping light PQ+1~PM (first pumping light arranged inside the pumping light wavelength band) whose wavelength spectrum has been narrowed by the optical filter 1b, as will be described later. The optical circulator 1d as a first optical means supplies the wavelength-multiplexed pumping light P1-PM to the optical fiber 1e as a transmission path.

The optical fiber 1e as a transmission path propagates the above wavelength-multiplexed signal light S1-SN and the pumping light from the optical circulator 1d, and Raman-amplifies the wavelength-multiplexed signal light by counterporpagating pumping. The optical fiber 1e corresponds to the transmission path fiber 12 in the optical transmission system 10 shown in FIG. 2. Incidentally, the above WDM multiplexer 1c and optical circulator 1d function as a pumping light supplying means for supplying pumping light to the optical fiber 1e as a transmission path.

Figure 2:
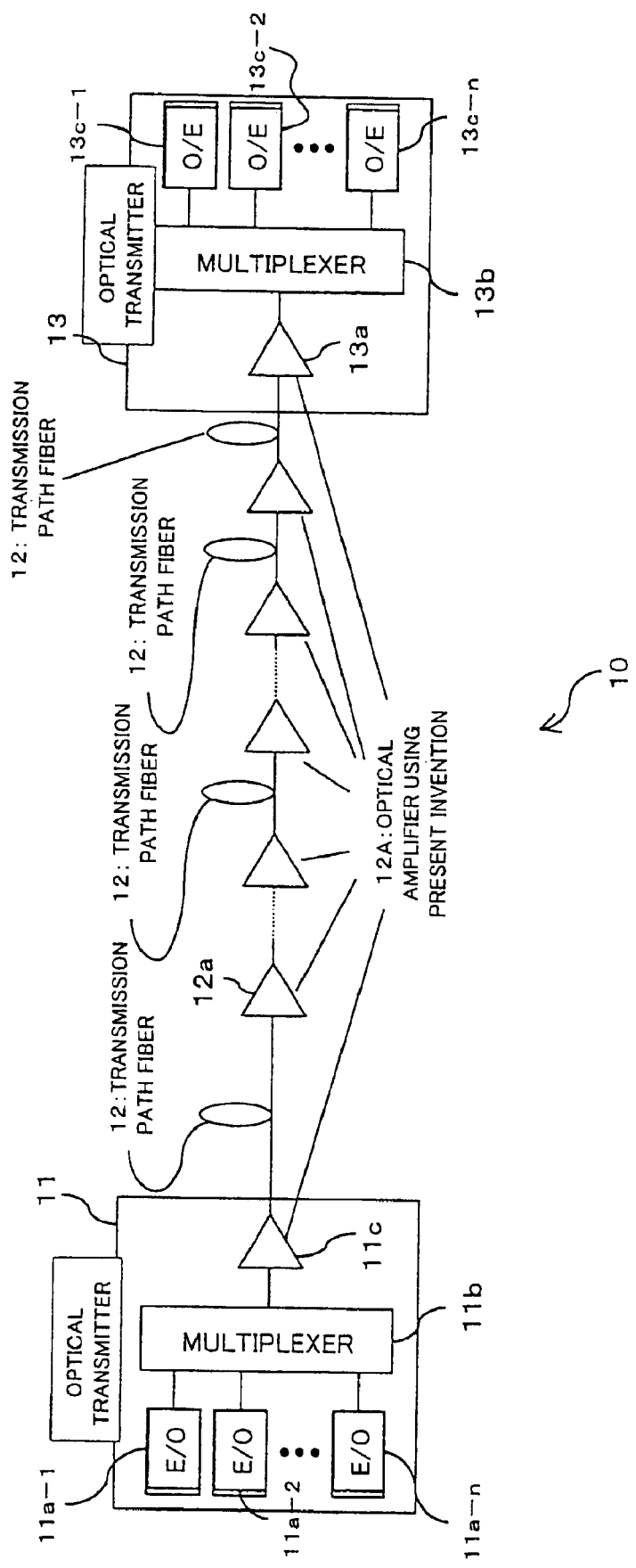
FIG. 2 is a block diagram showing an optical transmission system applied in embodiments.

With the above structure, the Raman amplifier 1A according to the first embodiment is applied as the optical amplifier 11c or 13a in the optical transmission system 10 shown in FIG. 2, or the optical amplifier 12a interposed on the transmission path fiber 12 to Raman-amplify the wavelength-multiplexed signal light S1-SN using the pumping light P1-PM.

Although pumping light PQ+1-PM in a part of the band of the pumping light P1-PM overlaps on a band of the above wavelength-multiplexed signal light S1-SN, a width of each wavelength spectrum of the pumping light PQ+1-PM in that band is narrowed by the optical filter 1b, thus the overlapping of the pumping light on the signal light is mitigated.

When a repeater section (a distance of an optical fiber between adjacent repeater amplifiers 12) of the optical transmission system 10 shown in FIG. 2 is about 50 km and an optical SN ratio of one repeater section is about 40 dB, a quantity of Rayleigh scattering of not larger than −57 dB to a signal optical power is required, in order to suppress a quantity of degradation of the optical SN ratio due to Rayleigh scattering to not larger than 0.1 dB. When a signal optical power per one wave is about −8 dBm and a pumping optical power at an input to the transmission path is about +17 dBm (about 50 mW), a quantity of Rayleigh scattering to the pumping optical power is required to be not larger than about −82 dB.

When a wavelength band to be allowed to the pumping light source is 2.5 nm, the pumping light power is −24 dB, for example, and a quantity of Rayleigh scattering is about −28 dB. Accordingly, if the power in the overall width of 2.5 nm is decreased by about −30 dB from a peak power at the center wavelength, it is possible to suppress a quantity of degradation of the optical SN ratio due to Rayleigh scattering to not larger than 0.1 dB.

According to the Raman amplifier 1A of the first embodiment of this invention, the signal light and the pumping light are mixedly arranged within a certain band, a width of each wavelength spectrum of the pumping light is narrowed by the optical filter 1b, whereby overlapping of wavelengths of signal optical components on pumping light components can be diminished. It is thus possible to suppress degradation of the optical SN ratio of the signal light due to linear crosstalk and non-linear crosstalk, and suppress degradation of the transmission capacity transmission characteristic.

In the above first embodiment, at least one wavelength of the pumping light PQ+1-PM to be arranged within a wavelength band of the wavelength-multiplexed signal light is enough, or plural kinds of pumping light may be arranged therein.

(a2) Description of First Modification of First Embodiment

According to the above first embodiment, the optical filter 1b is configured with a dielectric multilayer. Alternatively, two dielectric multilayers whose crystal orientations are 90° apart from each other are arranged in series in a direction of an optical path of the pumping light in order to resolve an orientation property, that is, polarization dependency, of a layer of the dielectric multilayer, whereby a filter characteristic similar to that in the above first embodiment can be provided by the two dielectric multiplyers.

Figure 5:
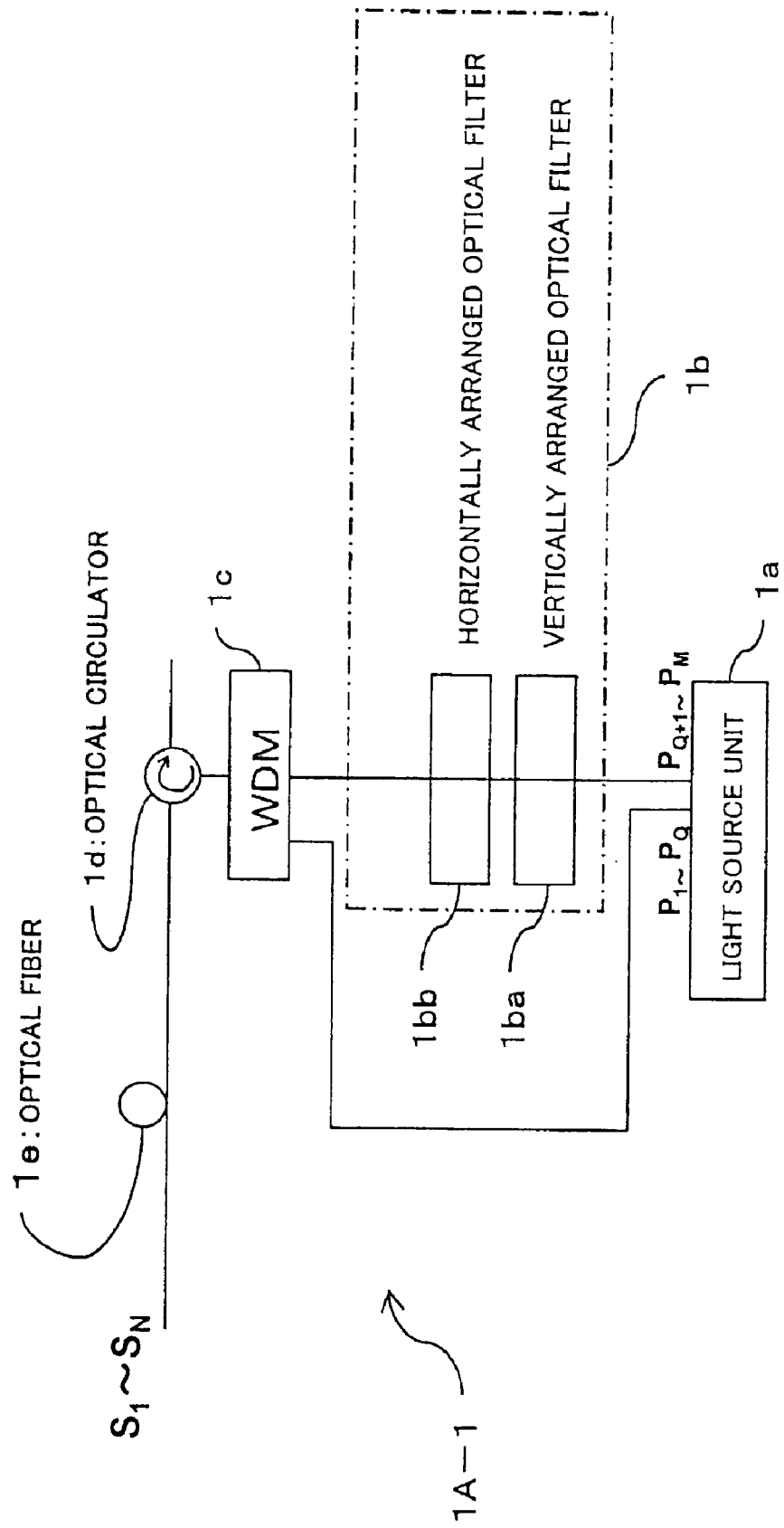
FIG. 5 is a block diagram showing a Raman amplifier according to a first modification of the first embodiment.

The amplifier may comprise, like a Raman amplifier 1A-1 shown in FIG. 5, an optical filter 1ba as the above optical filter 1b whose crystal direction is arranged perpendicular to a direction in which the pumping light travels so that the pumping light from the light source unit 1a is inputted, and an optical filter 1bb is arranged horizontally to the direction in which the pumping light travels, in the rear stage of the optical filter 1ba.

Note that the arrangement of the above optical filter 1ba and 1bb is not limited to the example shown in FIG. 5, but the optical filter 1bb may be arranged in the front stage of the optical filter 1ba. The two dielectric multilayers whose crystal orientations are 90° apart from each other may be formed into one module.

According to the Raman amplifier 1A-1 with the above structure, the optical filter 1b in which the polarization dependency is resolved can provide the similar advantages to those according to the above first embodiment, and the polarization dependency of the pumping light can be also resolved, which can improve stability of the amplification performance of the signal light.

(a3) Description of Second Modification of First Embodiment

Figure 6:
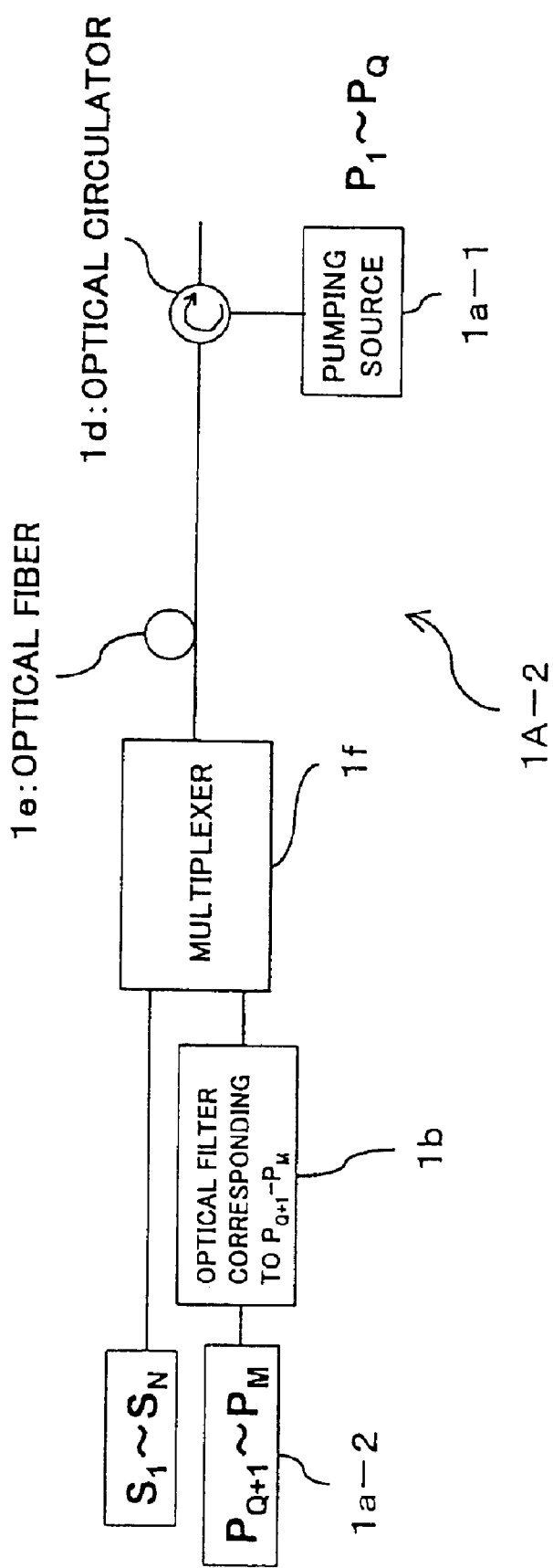
FIG. 6 is a block diagram showing a Raman amplifier according to a second modification of the first embodiment.

FIG. 6 is a block diagram showing a Raman amplifier 1A-2 according to a second modification of the first embodiment of this invention. The Raman amplifier 1A-2 shown in FIG. 6 has a different pumping mode by the pumping light from that of the amplifier (refer to reference character 1A) shown in FIG. 1. An optical filter 1b of the Raman amplifier 1A-2 can narrow a spread of each spectrum of the pumping light arranged inside a wavelength band of the wavelength-multiplexed signal light, as well.

The Raman amplifier 1A-2 shown in FIG. 6 comprises a light source units 1a-1 and 1a-2, an optical filter 1b, an optical circulator 1d, an optical fiber 1e and a multiplexer 1f. Incidentally, like reference characters in FIG. 6 designate like or corresponding parts in FIG. 1.

The light source unit 1a-1 as a second pumping source generates second pumping light P1-PQ arranged outside the wavelength band of the wavelength-multiplexed signal light. The pumping light P1-PQ from the light source unit 1a-1 propagates through the optical fiber 1e via the optical circulator 1d. A direction in which the pumping light P1-PQ travels is opposite to a direction in which the signal light S1-SN travels. Namely, the signal light S1-SN is counterpropagating-pumped by the pumping light P1-PQ.

The light source unit 1a-2 as a first pumping source generates first pumping light PQ+1-PM arranged inside the wavelength band of the wavelength-multiplexed signal light, and outputs it to the optical filter 1b. The optical filter 1b narrows a width of each wavelength spectrum of the pumping light PQ+1-PM from the light source unit 1a-2 to diminish overlapping of it on the wavelengths of signal light components.

The multiplexer 1f multiplexes the pumping light PQ+1-PM whose wavelength spectrum width has been narrowed by the optical filter 1b, by which overlapping on wavelengths of signal light components is thus diminished, and signal light S1-SN to be transmitted, and outputs the multiplexed light to the optical fiber 1e. Incidentally, a direction in which the pumping light PQ+1-PM travels in the same direction as the signal light S1-SN. In other words, the signal light S1-SN is copropagating-pumped by the pumping light PQ+1-PM.

The above multiplexer 1f functions as a second optical means which multiplexes first pumping light in which a spread of each spectrum has been narrowed by the optical filter 1b as copropragting pumping light and the wavelength-multiplexed signal light. The optical circulator 1d functions as a third optical means which supplies the second pumping light P1-PQ generated by the light source unit 1a-1 as counterpropagating pumping light to the optical fiber 1e.

In the Raman amplifier 1A-2 in the above structure shown in FIG. 6, the signal light is amplified by the pumping light P1-PQ for counterpropagating pumping and the pumping light PQ+1-PM for copropagating pumping, and a width of each spectrum of the pumping light is narrowed by the optical filter 1b in a stage before the signal light and the pumping light are multiplexed, whereby overlapping of wavelengths of the signal light and the pumping light is diminished.

The Raman amplifier 1A-2 according to the second modification of the first embodiment can suppress degradation of an optical SN ratio of the signal light due to Rayleight scattering of the pumping light, and suppress degradation of the transmission capacity transmission characteristic, like the first embodiment.

Figure 7:
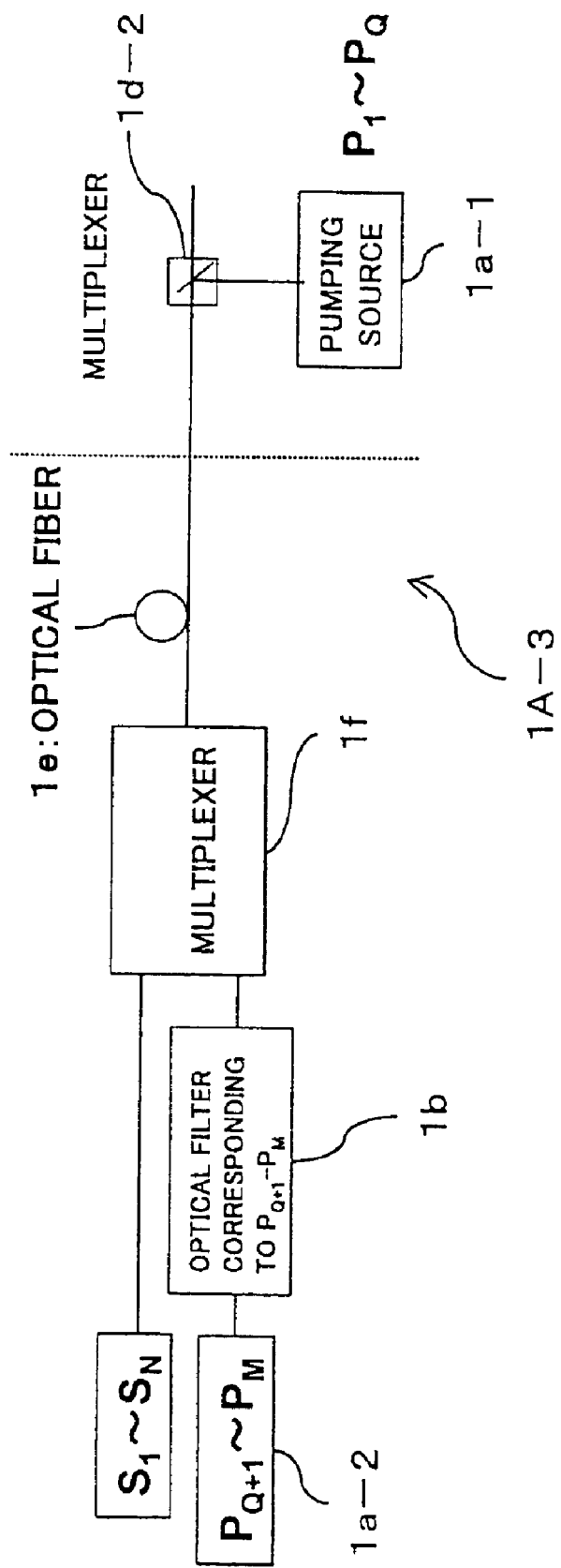
FIG. 7 is a block diagram showing a Raman amplifier according to a third modification of the first embodiment.

Other than the example shown in FIG. 6, a portion functioning as the second optical means which supplies the pumping light P1-PQ from the light source unit 1a-1 to the optical fiber 1e may be configured with a WDM multiplexer 1d-2 instead of the optical circulator 1d as a Raman amplifier 1A-3 shown in FIG. 7. In such case, it is possible to provide the above advantages as well.

When the Raman amplifier 1A-2 or 1A-3 is used as the repeater amplifier 12a or the amplifier 13a in the optical receiver 13 shown in FIG. 2, the light source unit 1a-2 may be disposed in an apparatus on the transmitting side in the front stage. For instance, with regard to the repeater amplifier 12a closest to the optical transmitter 11 on the transmission path, the light source unit 1a-2 and the optical filter 1b thereof may be disposed within the optical transmitter 11 in order to amplify the signal light in the repeater amplifier 12a.

(b1) Description of Second Embodiment

Figure 8:
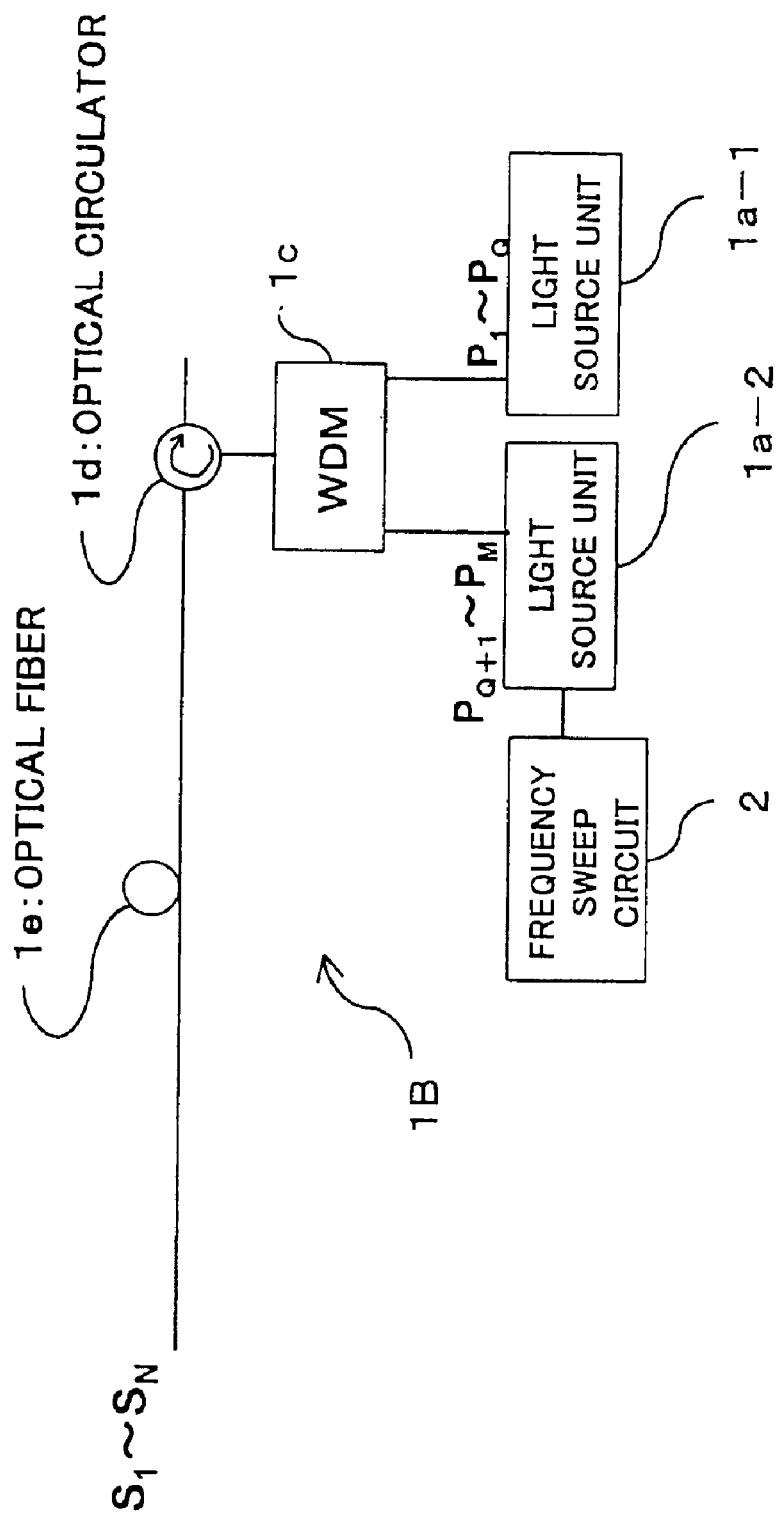
FIG. 8 is a block diagram showing a Raman amplifier according to a second embodiment of this invention.

FIG. 8 is a block diagram showing a Raman amplifier 1B according to a second embodiment of this invention. In the Raman amplifier 1B shown in FIG. 8, a plurality of wavelengths including a band of wavelength-multiplexed signal light are arranged as pumping light, so that Raman-amplification in a wide band is feasible, while the optical SN ratio is decreased, like the example according to the above first embodiment. The Raman amplifier 1B comprises light source units 1a-1 and 1a-2, a WDM multiplexer 1c, an optical circulator 1d, and an optical fiber 1e and a frequency sweep circuit 2.

A difference between the Raman amplifier 1B according to the second embodiment and the Raman amplifier (refer to reference character 1A) according to the first embodiment is that the Raman amplifier 1B does not have the optical filter 1b interposed in the front stage of the optical circulator, but has the frequency sweep circuit 2 which sweeps each wavelength of pumping light arranged inside a band of wavelength-multiplexed signal light.

Figure 9A:
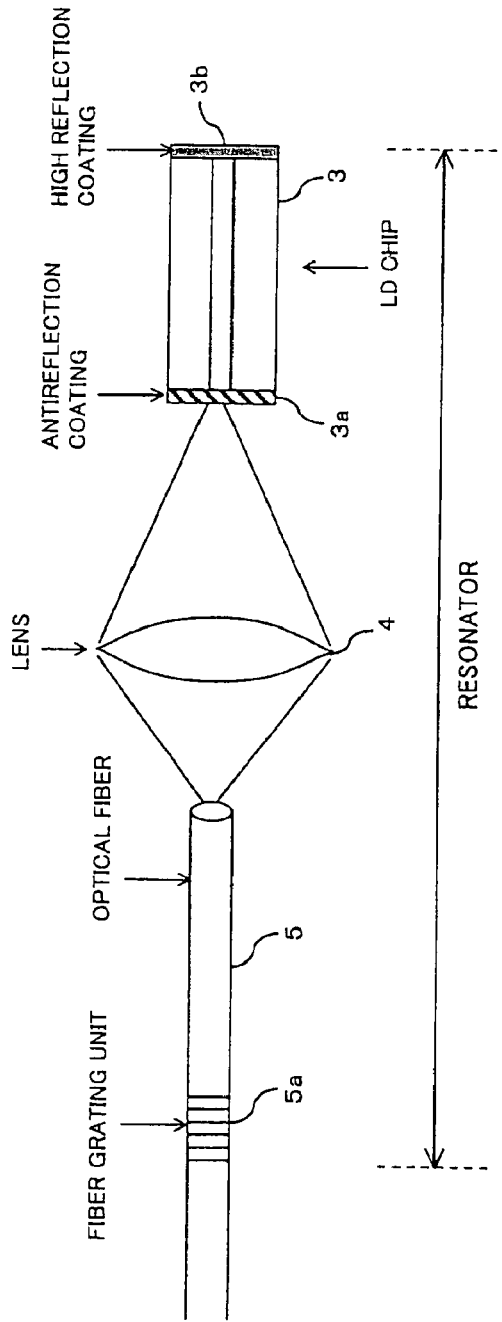
FIGS. 9A and 9B are respectively block diagrams showing an essential part of a light source unit configuring the Raman amplifier according to the second embodiment.

The light source units 1a-1 and 1a-2 of the Raman amplifier 1B according to the second embodiment include pumping sources equal in number to (M-P) wavelengths arranged as pumping light, for example, and multiplexers which multiplex the pumping light from the pumping sources. The pumping source comprising, as shown in FIG. 9A, an LD chip 3 which is driven by an electric current to emit laser light, a lens 4 which condenses the laser light emitted by the LD chip 3 and supplies it to an optical fiber 5 in the rear stage, and the optical fiber 5 having a fiber grating unit 5a.

On an end of the LD chip 3 on the side of the lens 4 coated is an antireflection member 3a. On the other end of the LD chip 3 on the opposite side of the lens 4 coated is a high reflection member 3b. In each of the light source units 1a-1 and 1a-2, laser light emitted by the LD chip 3 resonates in an optical path between the high reflection member 3b and the fiber grating unit 5a, whereby pumping light at a specific frequency can be outputted from the fiber grating unit 5a.

By controlling an expanding-contracting operation or a bending operation of the fiber grating unit 5a, or a member temperature of the fiber grating unit 5a, it is possible to change spacing of a grating configuring the fiber grating 5a, thereby changing a frequency of outputted pumping light.

Figure 10A:
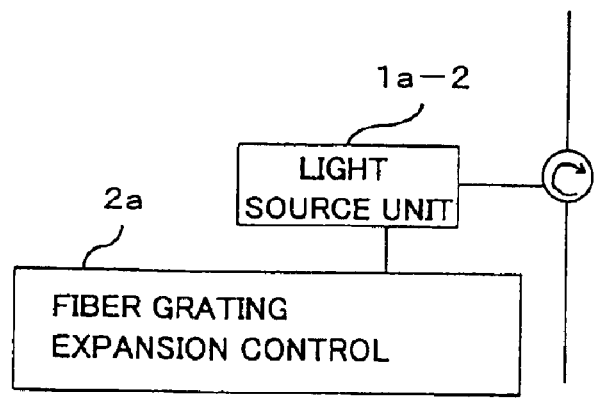
FIG. 10A is a block diagram showing an essential part of the light source unit according to the second embodiment.

The frequency sweep circuit 2 functions as a variable controlling means which variably controls wavelengths of the pumping light generated by the light source unit 1a-2. As shown in FIG. 10A, for example, the frequency sweep circuit 2 is configured with a fiber grating expansion control unit 2a which controls to expand the fiber grating unit 5a in the light source unit 1a-2.

The fiber grating expansion control unit 2a controls expansion of the fiber grating using a characteristic of changing a wavelength of the output pumping light under an expansion control of the fiber grating unit 5a, thereby performing a sweep control on the pumping light as shown in, for example, FIG. 11.

Namely, as shown in FIG. 11, by sweeping the pumping light frequency, the pumping light frequency in a longitudinal direction of the fiber is changed. In concrete, under a control of the fiber grating expansion control unit 2a, the fiber grating expansion control unit 2a controls to linearly increase the pumping light frequency for frequency corresponding to a difference in wavelength of about 0.3 nm between the time when the wavelength-multiplexed optical signal is first transmitted and the time when the first wavelength-multiplexed optical signal reaches an apparatus (the repeater amplifier 12a or the optical receiver 13) in the next stage through the optical fiber 1e (the transmission path fiber 12).

Figure 12:
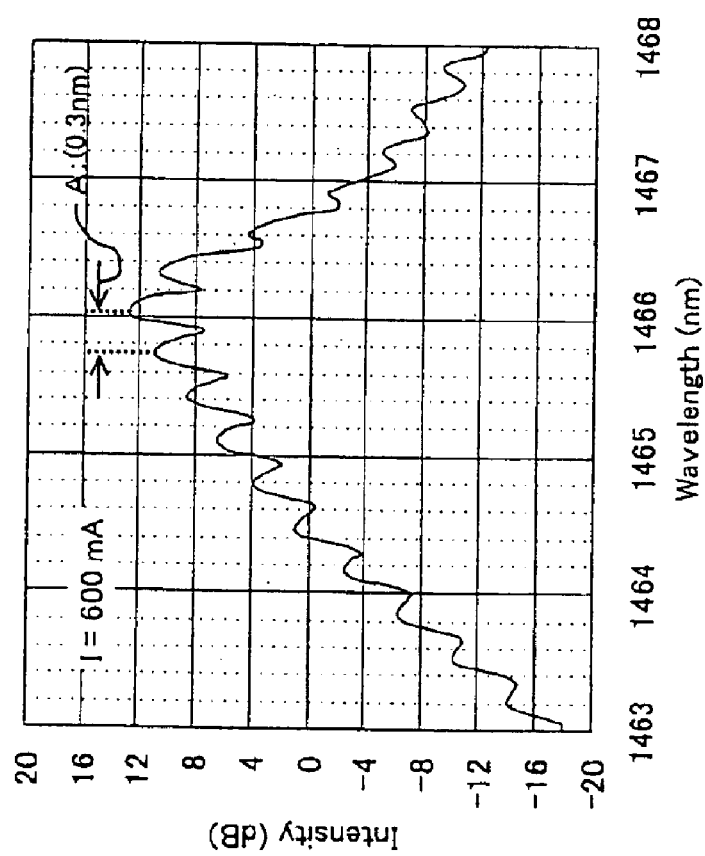
FIG. 12 is a diagram for illustrating mode spacing of pumping light.

A sweep frequency for the pumping light by the fiber grating expansion control unit 2a is set smaller than mode spacing of the pumping light. It is thereby possible to diminish overlapping of it on four-wave mixing light generated by an adjacent mode when the pumping light is swept. The pumping light has a spectrum as shown in FIG. 12, for example. Mode spacing of the pumping light shown in FIG. 12 (refer to reference character A in FIG. 12, for example) is about 0.3 nm. If the pumping light sweep frequency is not larger than 0.3 nm which is not larger than the mode spacing, it is possible to diminish four-wave mixing caused by the adjacent mode.

The Raman amplifier in the above structure according to the second embodiment of this invention is applied as the amplifier 11c or 13a in the optical transmission system 10 or the optical amplifier 12a interposed on the transmission path fiber 12 shown in FIG. 2 to Raman-amplify the wavelength-multiplexed signal light S1-SN by the pumping light PL-PM.

The pumping light PQ+1-PM in a part of a band of the pumping light P1-PM overlaps on a band of the above wavelength-multiplexed signal light S1-SN. However, a frequency of the pumping light PQ+1-PM in that band is swept under the expansion control on the fiber gratings by the fiber grating expansion control unit 2a as the frequency sweep circuit 2 to suppress generation of four-wave mixing light at the same wavelength, thus degradation of the waveform due to four-wave mixing light can be diminished.

A frequency which is to be a reference to increase the above pumping light frequency is preferably changed within a range of about ±0.15 nm with a frequency arranged as the pumping light PQ+1-PM being the reference in the example of the first embodiment.

The Raman amplifier 1B according to the second embodiment sweeps each frequency of the pumping light PQ+1-PM in that band under the expansion control on the fiber grating by the fiber grating expansion control unit 2a as the frequency sweep circuit 2 to suppress generation of four-wave mixing light at the same wavelength. It is therefore possible to diminish degradation of the waveform due to four-wave mixing light to suppress degradation of the optical SN ratio, thereby suppressing degradation of the transmission capacity transmission characteristic.

Figure 10B:
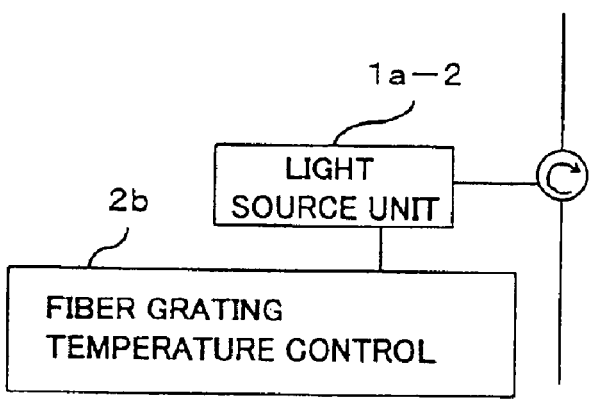
FIGS. 10B through 10D are block diagrams showing an essential part of the light source unit according to modifications of the second embodiment.
Figure 10C:
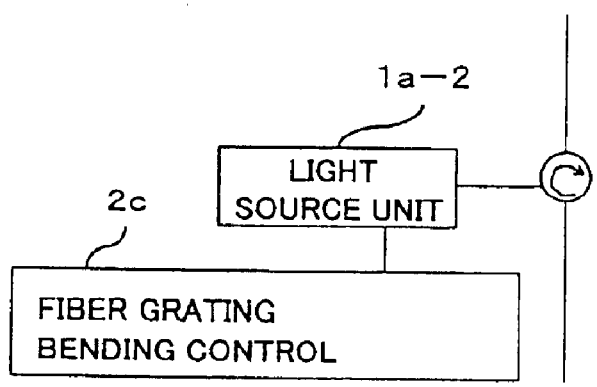
Figure 10D:
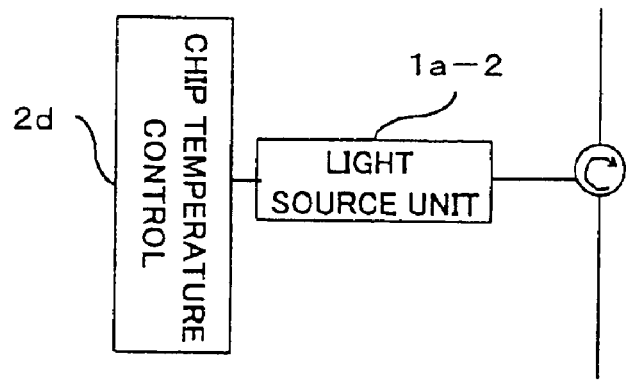

In the above Raman amplifier 1B according to the second embodiment, the fiber grating expansion control unit 2a as the frequency sweep circuit 2 performs the expansion control on the fiber grating unit 5a to variably control frequencies of the pumping light generated by the light source unit 1a-2. However, this invention is not limited to this example, but the frequency sweep circuit 2 may be configured as shown in FIG. 10B, 10C or 10D, for example. In such case, it is possible to provide the similar advantages like the second embodiment.

When the frequency sweep circuit 2 is configured with a fiber grating temperature control unit 2b shown in FIG. 10B, the fiber grating temperature control unit 2b controls a temperature of members of the fiber grating unit 5a to change spacing of the grating configuring the fiber grating unit 5a, thereby to change the frequencies of the outputted pumping light like the example shown in FIG. 11.

When the frequency sweep circuit 2 is configured with a fiber grating bending control unit 2c shown in FIG. 10C, the fiber grating bending control unit 2c performs a bending control on the fiber grating unit 5a to change spacing of the grating configuring the fiber grating unit 5a, thereby to change the frequencies of the outputted pumping light like the example shown in FIG. 11.

The frequency sweep circuit 2 may be configured with a chip temperature control unit 2d as shown in FIG. 10D. Namely, the chip temperature control unit 2d controls a temperature of members of the LD chip 3 of the light source unit 1a-2 to change the frequencies of the outputted pumping light like the example shown in FIG. 11.

(b2) Description of First Modification of Second Embodiment

Figure 9B:
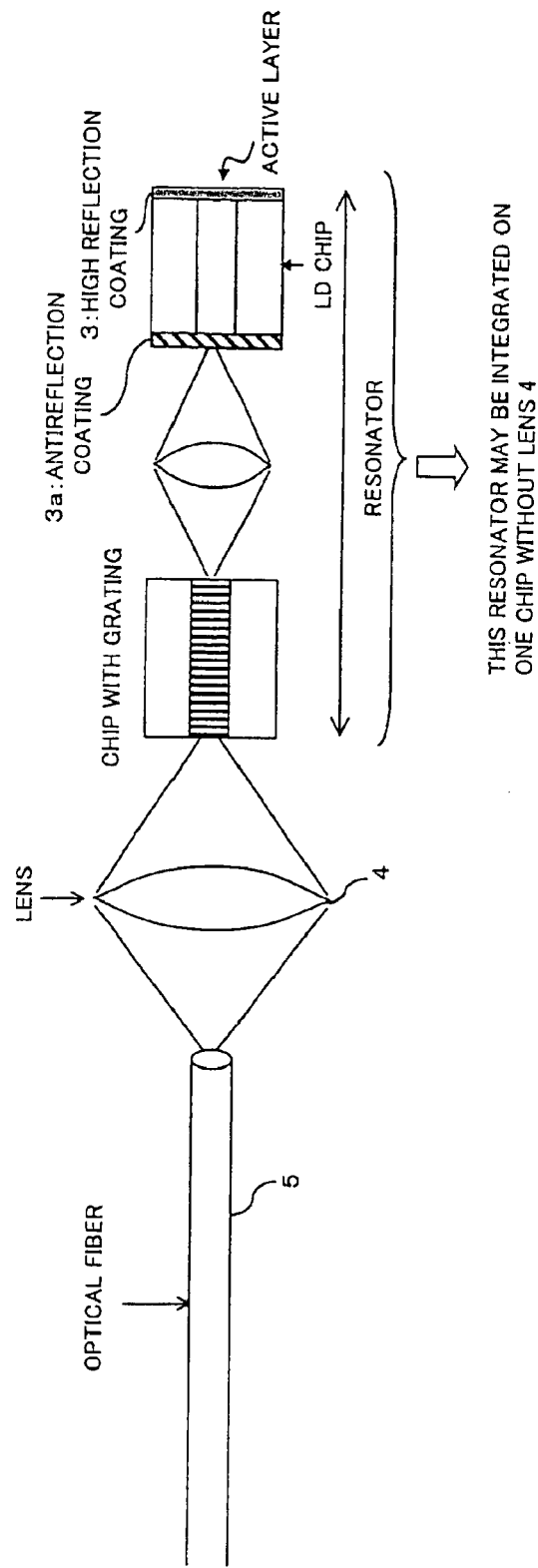

In the above Raman amplifier 1B according to the second embodiment, the light source units 1a-1 and 1a-2 have the pumping sources equal in number to frequencies of the pumping light to be arranged, and the multiplexing unit. As a structure of the pumping source, the pumping source may be alternatively configured with an LD chip 3A, a lens 4 and an optical fiber 5A as shown in FIG. 13 or FIG. 9B, other than the structure shown in FIG. 9A.

Figure 13:
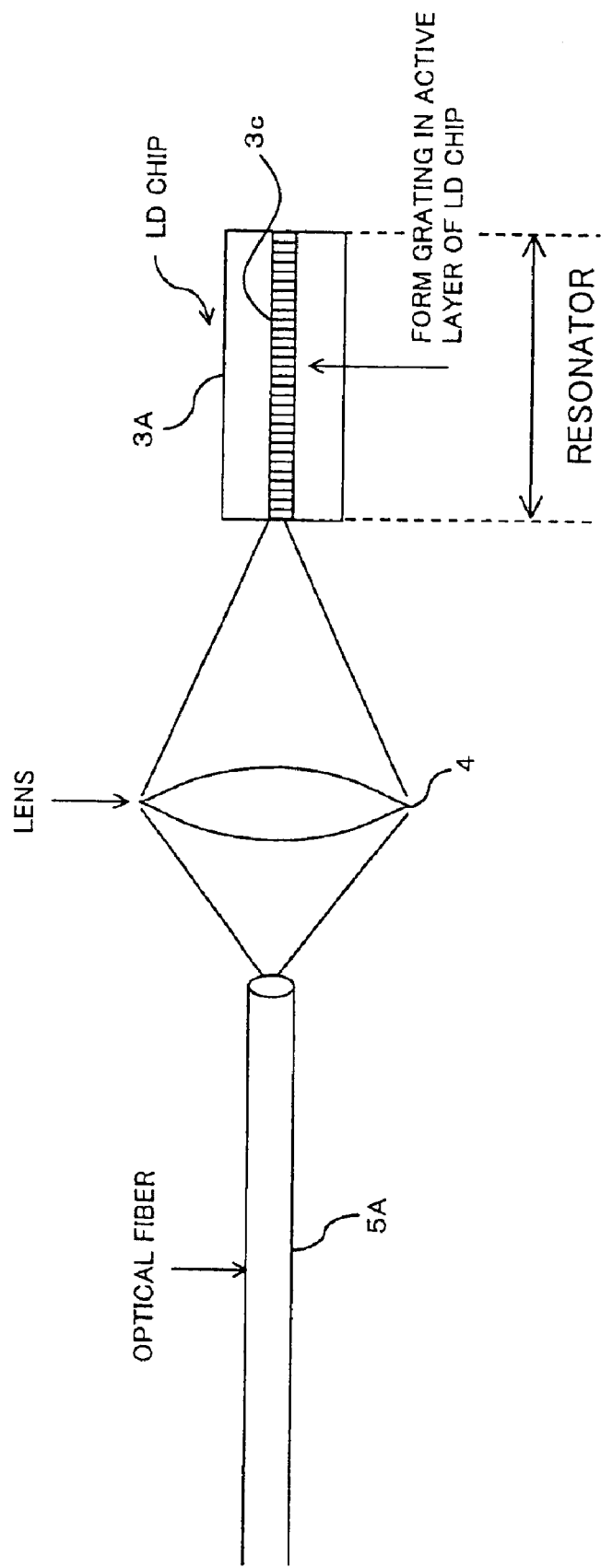
FIG. 13 is a block diagram showing an essential part of a light source unit configuring a Raman amplifier according to modifications of the second embodiment.

A grating 3c is formed in an active layer of the LD chip 3A in the pumping source as shown in FIG. 13. The grating 3c provides a similar function to that of the fiber grating unit 5 shown in FIG. 9A. Namely, laser light emitted by the LD chip 3A resonates inside the LD chip 3A, whereby pumping light at a specific frequency can be outputted to the optical fiber 5A. FIG. 9B is a block diagram showing an essential part of a light source unit configuring the Raman amplifier according to the second embodiment. The resonator may be configured as shown in FIG. 9B. It is to be noted that the resonator shown in FIGS. 9A and 9B may use an LD chip without reflection members 3a and 3b.

Figure 14A:
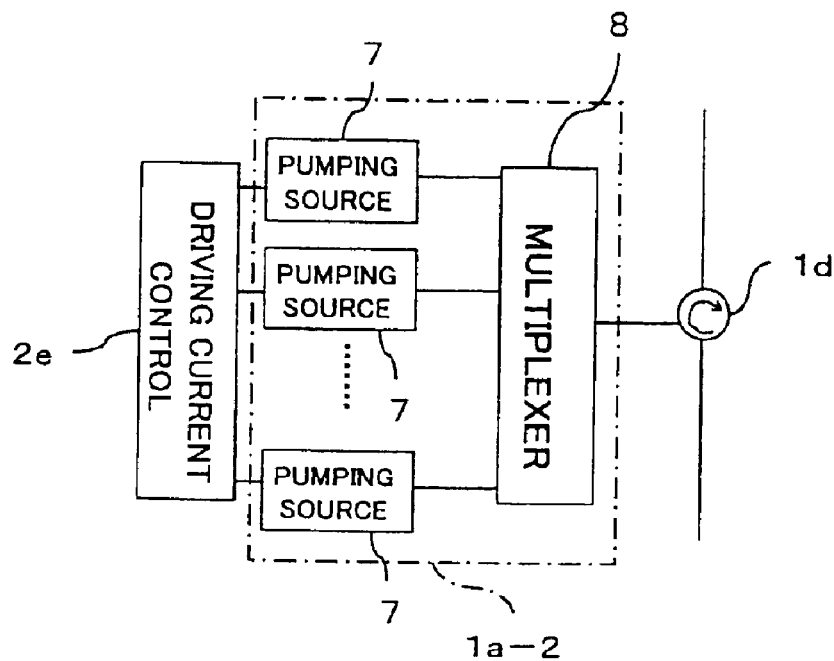
FIGS. 14A and 14B are block diagrams showing an essential part of the light source unit according to the modifications of the second embodiment.

The frequency sweep circuit 2 sweeping each pumping light frequency from the light source unit 1a-2 having the pumping sources shown in FIG. 13 may be configured with a driving current control unit 2e shown in FIG. 14A, for example. The driving current control unit 2e controls a driving current of the LD chip 3A of the pumping source 7 configuring the light source unit 1a-2, thereby sweeping the pumping light like the example in FIG. 11, for example.

Figure 14B:
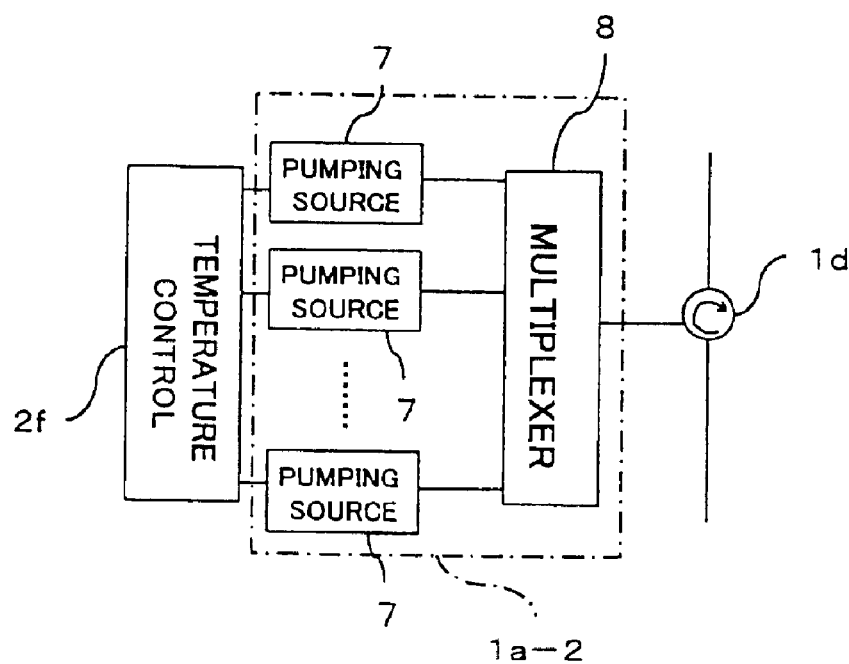

Alternatively, as a structure of the frequency sweep circuit 2 for sweeping the pumping light frequency from the light source unit 1a-2, the frequency sweep circuit 2 may be configured with a temperature control unit 2f shown in FIG. 14B, other than the structure shown in FIG. 14A. The temperature control unit 2f shown in FIG. 14B controls a temperature of members of the above LD chip 3A, thereby sweeping the pumping light like the example shown in FIG. 11, for example.

In FIGS. 14A and 14B, reference numeral 8 designates a multiplexer configuring the light source unit 1a-2.

The Raman amplifier in the above structure sweeps each frequency of the pumping light PQ+1-PM inside a band, in which the pumping light and the wavelength-multiplexed signal light are mixedly present, under a control of the driving current control unit 2e or the temperature control unit 2f as the frequency sweep circuit 2, thereby suppressing generation of four-wave mixing light at the same wavelength, which allows advantages similar to those provided by the above second embodiment.

(b3) Description of Second Modification of Second Embodiment

Figure 15:
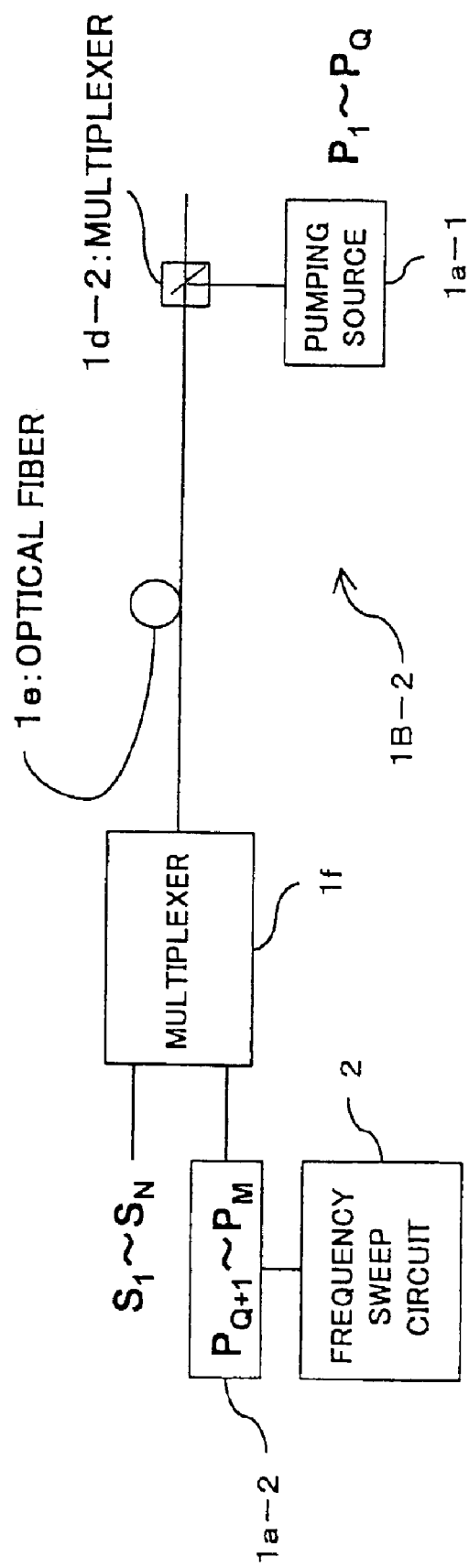
FIG. 15 is a block diagram showing a Raman amplifier according to modifications of the second embodiment.

FIG. 15 is a block diagram showing a Raman amplifier 1B-2 according to a second modification of the second embodiment of this invention. The Raman amplifier 1B-2 shown in FIG. 15 has a different pumping mode by pumping light, as compared with the Raman amplifier (refer to reference character 1B) shown in FIG. 8. With this, an arrangement of the frequency sweep circuit 2 differs from that shown in FIG. 8.

In the Raman amplifier 1B-2, the light source units 1a-1 and 1a-2 are such arranged that the first pumping light PQ+1-PM is copropagating pumping light, whereas the second pumping light P1-PQ is counterpropagating pumping light, like those shown in FIG. 7. Incidentally, like reference characters in FIG. 15 designates like or corresponding parts in FIG. 7 or 8.

The pumping source configuring the light source unit 1a-2 is configured similarly to that shown in FIG. 9A, whereas the frequency sweep circuit 2 is configured with the above fiber grating expansion control unit 2a shown in FIG. 10A. Using a characteristic of changing a wavelength of output pumping light under the expansion control on the fiber grating unit 5a, it is possible to control and expand the fiber grating so that the pumping light is swept as shown in FIG. 11, for example.

Namely, a pumping light frequency in a longitudinal direction of the fiber at the time of sweeping of the pumping light frequency is changed as shown in FIG. 11. In other word, under a control of the fiber grating expansion control unit 2a, a pumping light frequency is controlled to be linearly increased for a frequency corresponding to a difference in wavelength of about 0.3 nm between the time when the wavelength-multiplexed optical signal is first transmitted and the time when the first wavelength-multiplexed optical signal reaches an apparatus (the repeater amplifier 12a or the optical receiver 13) in the next stage through the optical fiber 1e (the transmission path fiber 12), as will be described later.

In the Raman amplifier 1B-2 in the above structure shown in FIG. 15, the wavelength-multiplexed optical signal is Raman-amplified by the pumping light P1-PQ for counterpropagating pumping and the pumping light PQ+1-PM for copropagating pumping. At this time, the fiber grating expansion control unit 2a as the frequency sweep circuit 2 performs the sweep control on the pumping light to suppress generation of four-wave mixing light at the same wavelength. This can decrease degradation of the waveform due to four-wave mixing light.

In the Raman amplifier 1B-2 according to the second modification of the second embodiment, the fiber grating expansion control unit 2a performs the sweep control on the pumping light to suppress generation of four-wave mixing light in the same waveform, like the example according to the above second embodiment. It is thus possible to diminish degradation of the waveform due to four-wave mixing light, and suppress degradation of the optical SN ratio, thus suppress degradation of the transmission capacity transmission characteristic.

The above frequency sweep circuit 2 may be configured with the fiber grating expansion control unit 2a shown in FIG. 10A, or may be configured as shown in FIG. 10B, 10C, 10D, 14A or 14B (refer to reference characters 2b to 2f).

Other than the example shown in FIG. 15, a function of the mutliplexer 1d-2 may be accomplished by the optical circulator 1d (refer to FIG. 6). In such case, the above advantages can be provided as well.

When the Raman amplifier 1A-2 or 1A-3 is used as the repeater amplifier 12a or the amplifier 13a in the optical receiver 13 shown in FIG. 2, the light source unit 1a-2 may be disposed in an apparatus on the transmitting side in the front stage. For instance, with regard to the repeater amplifier closest to the optical transmitter 11 on the transmission path, the light source unit 1a-2 and the frequency sweep circuit 2 may be disposed in the optical transmitter 11 in order to amplify the signal light in the repeater amplifier 12.

C Description of Third Embodiment

Figure 16:
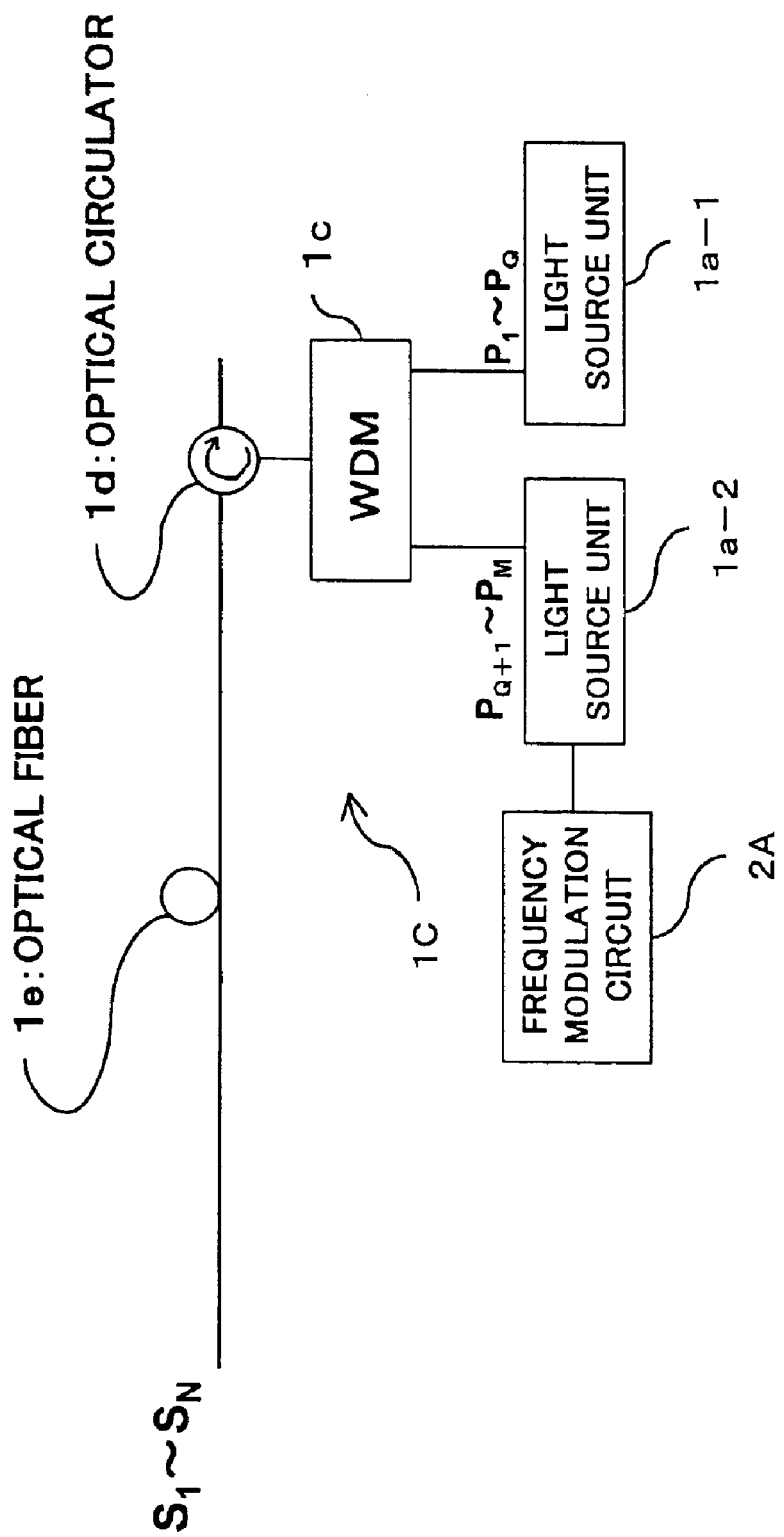
FIG. 16 is a block diagram showing a Raman amplifier according to a third embodiment of this invention.

FIG. 16 is a block diagram showing a Raman amplifier 1C according to a third embodiment of this invention. The Raman amplifier 1C shown in FIG. 16 has a different mode of changing the pumping light frequencies, as compared with the Raman amplifier 1B shown in FIG. 8. Other portions in the structure are basically the same as those in the example shown in FIG. 8.

In the Raman amplifier 1C shown in FIG. 16, the light source units 1a-1 and 1a-2 are such arranged that the first pumping light PQ+1-PM and the second pumping light P1-PQ are counterpropagating pumping light, like the Raman amplifier 1B shown in FIG. 8. Incidentally, like reference characters in FIG. 16 designate like or corresponding parts in FIG. 8. A pumping source configuring the light source unit 1a-2 has the structure shown in FIGS. 9A and 9B.

Figure 17:
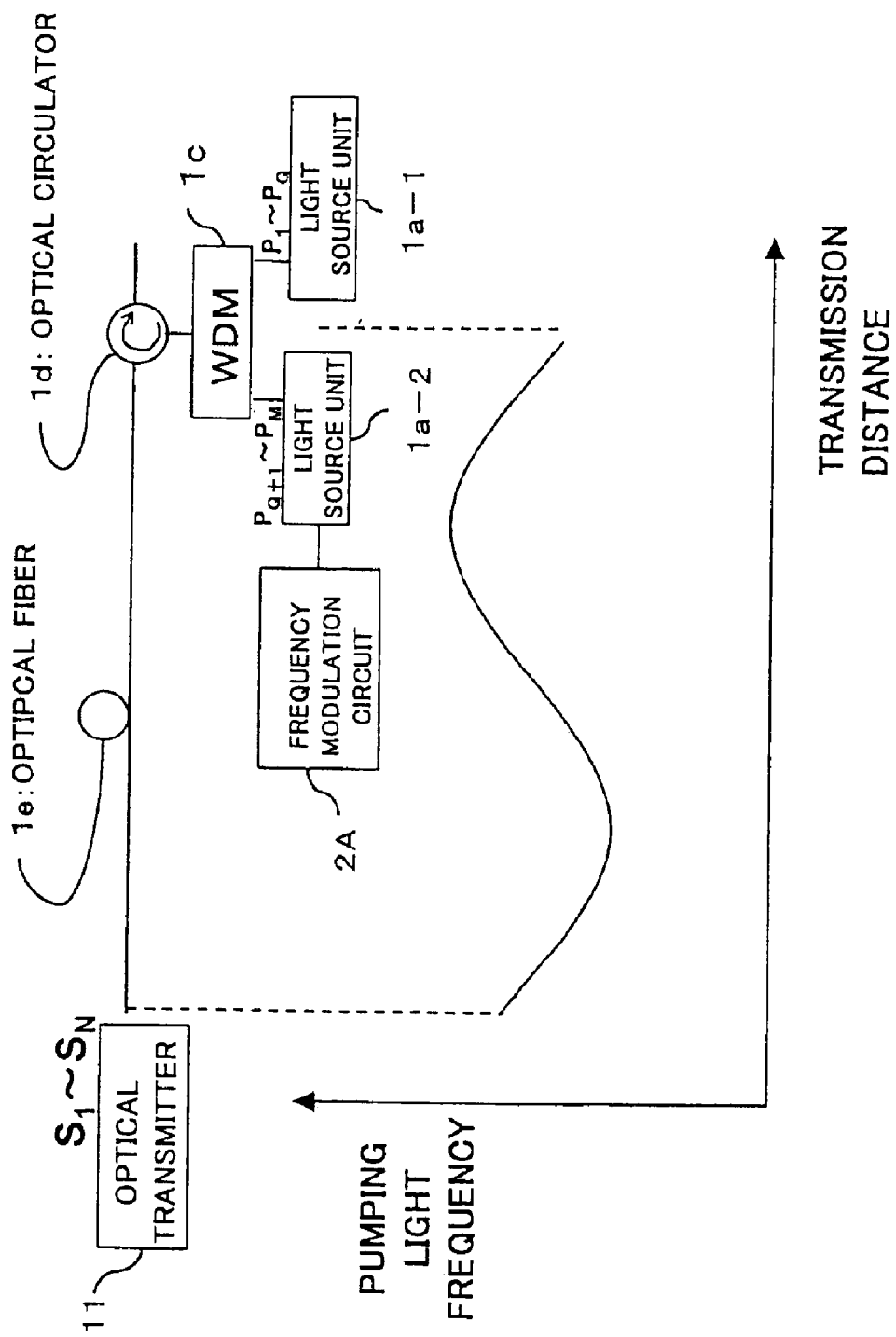
FIG. 17 is a diagram for illustration a modulation control of the Raman amplifier according to the third embodiment.

A frequency modulating circuit 2A functions as a variable controlling means which variably controls each wavelength of pumping light generated by the light source unit 1a-2. The frequency modulating circuit 2A is configured with the above fiber grating expansion control unit 2a shown in FIG. 10A. The frequency modulating circuit 2A performs the expansion control on the fiber grating unit 5a (refer to FIGS. 9A and 9B) of the pumping source configuring the light source unit 1a-2 to modulate the pumping light as shown in FIG. 17.

Namely, the frequency modulating circuit 2A changes a pumping light frequency in a longitudinal direction of the fiber at the time when the pumping light frequency is modulated, as shown in FIG. 11. In other words, the frequency modulating circuit 2A performs a sine wave modulation control on the pumping light frequency for frequency corresponding to a difference in wavelength of about 0.3 nm, for example, between the time when the wavelength-multiplexed signal light is first transmitted and the time when the first wavelength-multiplexed signal light reaches an apparatus (the repeater amplifier 12a or the optical receiver 13) in the next stage through the optical fiber 1e (the transmission path fiber 12), under a control of the fiber grating expansion control unit 2a.

As a mode of the above pumping light frequency modulation, anything such as a triangular wave or the like other than a sine wave may be applicable so long as it can periodically modulate the pumping light.

The Raman amplifier 1B-1C in the above structure shown in FIG. 16 Raman-amplifies the wavelength-multiplexed signal light by the pumping light P1-PQ for counterpropagating pumping and the pumping light PQ+1-PM for counterpropagating pumping. At this time, the fiber grating expansion control unit 2a as the frequency modulating circuit 2A performs the sine wave modulation control on the pumping light to suppress generating of four-wave mixing light at the same wavelength, thereby to diminish degradation of the waveform due to four-wave mixing light.

Although a band of the pumping light PQ+1-PM generated by the light source unit 1a-2 overlaps on a band of the above wavelength-multiplexed signal light S1-SN, the fiber grating expansion control unit 2a as the frequency modulating circuit 2A performs the sine wave modulation on each frequency of the pumping light PQ+1-PM in that band under the expansion control of the fiber grating expansion control unit 2a as the frequency modulating circuit 2A on the fiber grating to suppress generation of four-wave mixing light at the same wavelength, thereby diminishing degradation of the waveform due to four-wave mixing light.

By setting the above modulation frequency smaller than the mode spacing, it is possible to diminish overlapping of four-wave mixing light generated by the adjacent mode at the time of sweeping. The pumping light has a spectrum as shown in FIG. 12, for example. Mode spacing (refer to a reference character A in FIG. 12, for example) of the pumping light shown in FIG. 12 is about 0.3 nm. If the pumping light modulation frequency is not larger than 0.3 nm that is not larger than the above mode spacing, it is possible to diminish four-wave mixing caused by the adjacent mode.

In the Raman amplifier 1C according to the third embodiment, the fiber grating expansion control unit 2a performs the modulation control on the pumping light to suppress generation of four-wave mixing light at the same wavelength, like the example according to the second embodiment. This can diminish degradation of the waveform due to four-wave mixing, suppress degradation of the optical SN ratio, and suppress degradation of the transmission capacity transmission characteristic.

Figure 18:
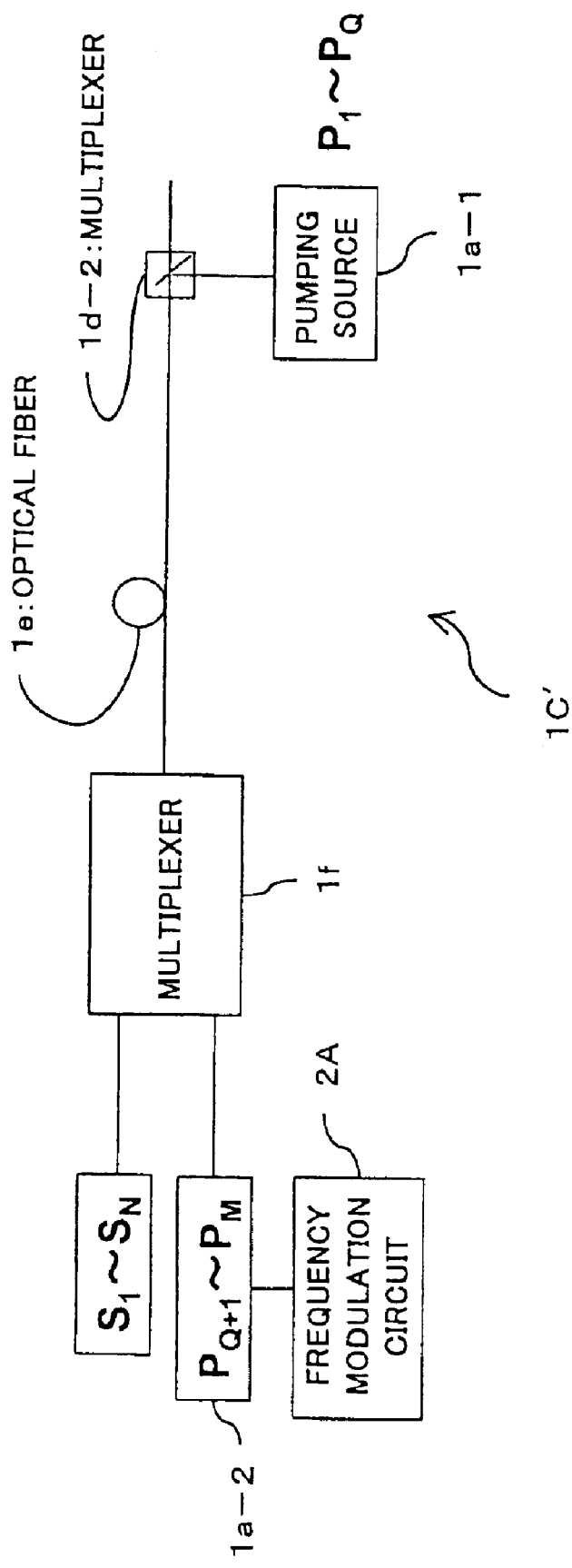
FIG. 18 is a block diagram showing a Raman amplifier according to a modification of the third embodiment.
Figure 19:
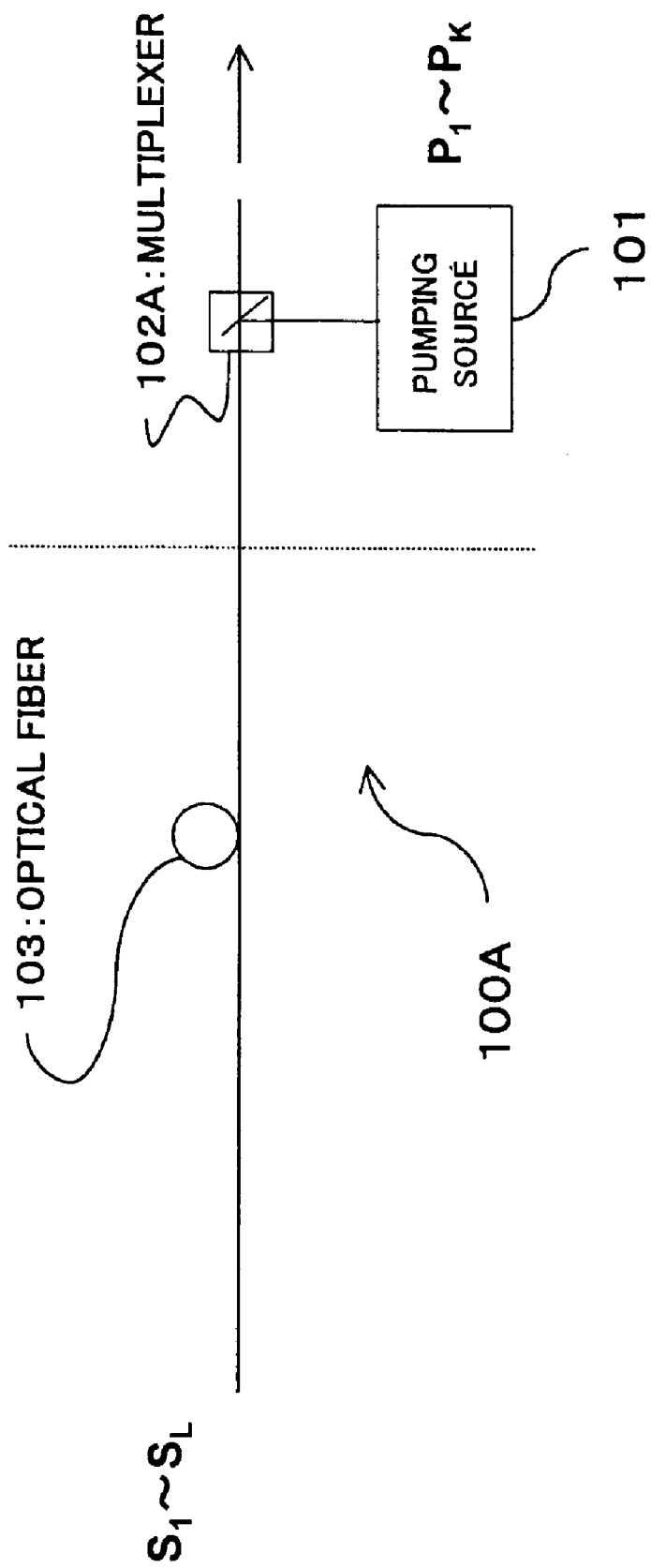
FIGS. 19 and 20 are block diagrams showing known Raman amplifiers.
Figure 20:
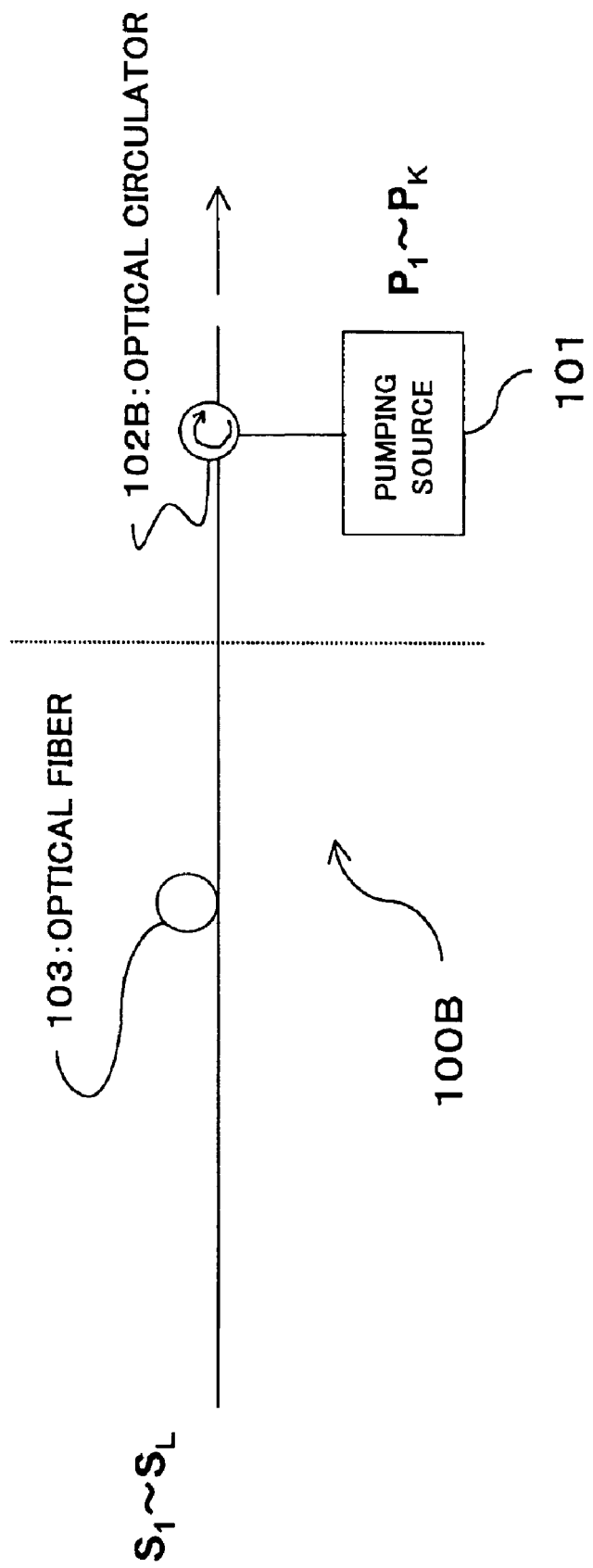
Figure 21:
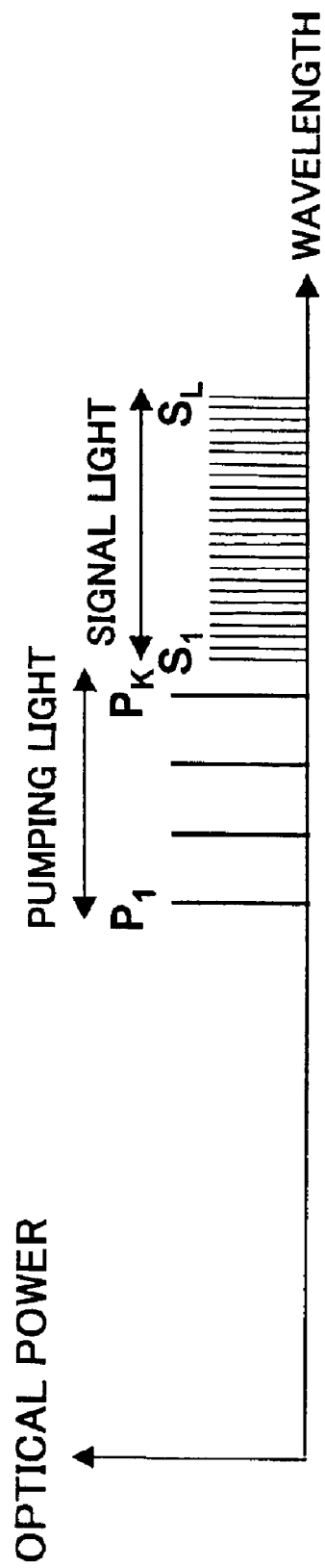
FIG. 21 is a diagram showing a relationship in arrangement of wavelengths between signal light and pumping light in a known Raman amplifier.
Figure 22:
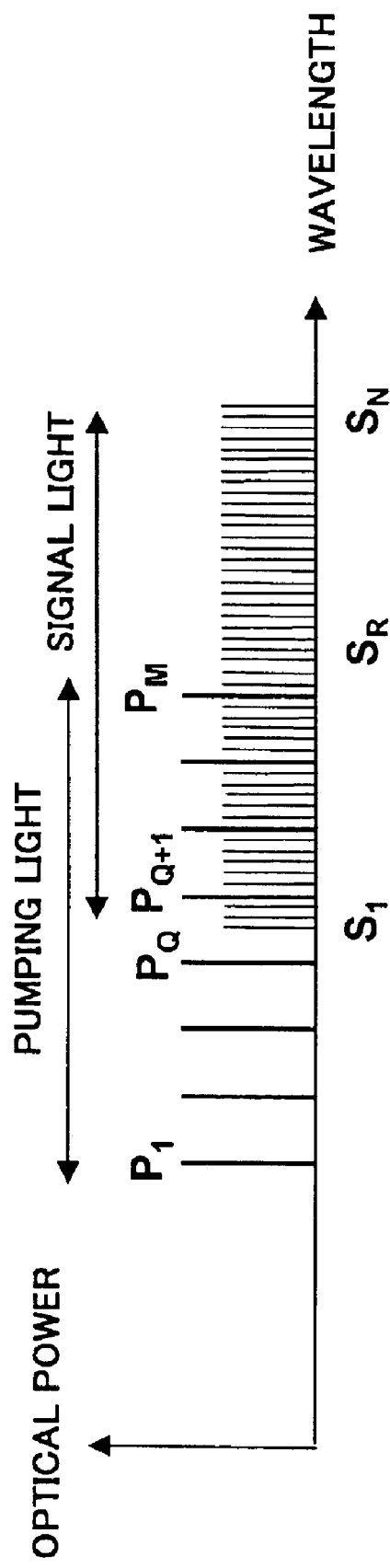
FIGS. 22 and 23 are diagram showing examples of arrangement in which signal light and pumping light are mixedly present in a certain band.
Figure 23:
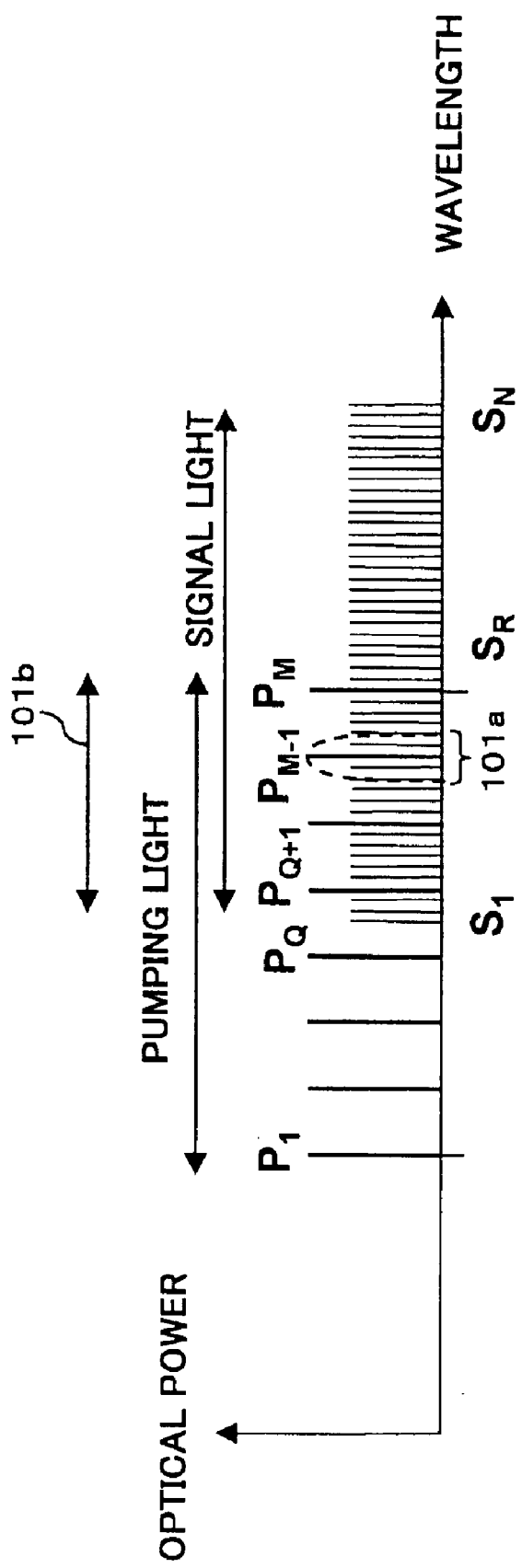
Figure 24:
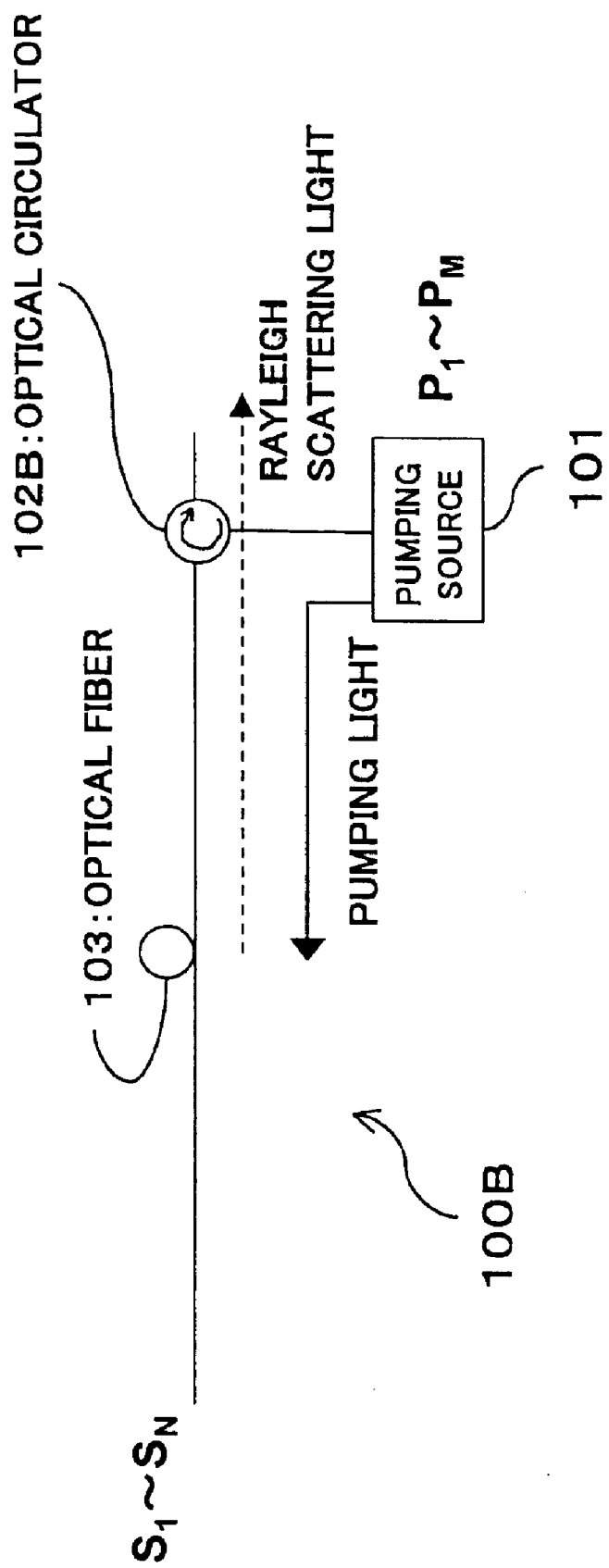
FIG. 24 is a diagram for illustrating an effect of Rayleigh scattering light occurring when Raman amplification is performed in an arrangement in which signal light and pumping light are mixedly present in a certain band.
Figure 25:
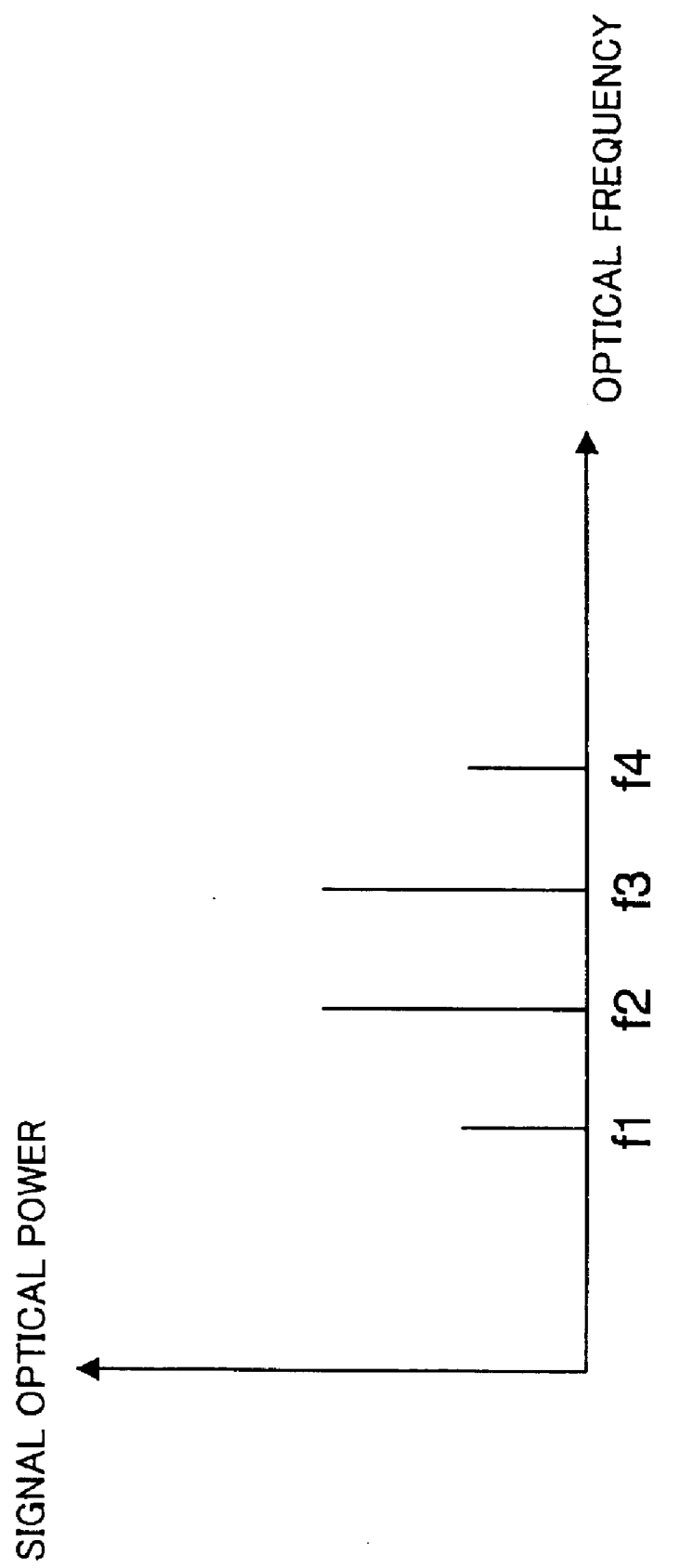
FIG. 25 is a diagram for illustrating an arrangement of wavelengths in which four-wave mixing occurs.

In the Raman amplifier 1C according to the third embodiment, the pumping light P1-PM is used as counterpropagating pumping light. However, this invention is not limited to this example. As shown in FIG. 18, for example, the pumping light (pumping light overlapping on a band of the wavelength-multiplexed signal light S1-SN) from the light source unit 1a-2 may be used as copropagating pumping light. In which case, similar advantages may be provided, like the above example according to the third embodiment, as a matter of course.

In the above third embodiment, the sine wave modulation is performed as a mode of modulation by the frequency modulating circuit 2A. However, other modulating method may be applied at least so long as it can suppress generation of four-wave mixing at the same wavelength.

The above frequency modulating circuit 2A is configured with the fiber grating expansion control unit 2a shown in FIG. 10A. Alternatively, the frequency modulating circuit 2A may be configured as shown in FIG. 10B, 10C, 10D, 14A or 14B (refer to reference characters 2b to 2f).

Other than the above example shown in FIG. 15, a function of the multiplexer 1d-2 may be accomplished by the optical circulator 1d (refer to FIG. 6). In such case, it is possible to provide the same advantages as the above.

When the Raman amplifiers 1A-2 and 1C-3 are used as the repeater amplifier 12a, or the amplifier 13a in the optical receiver 13 shown in FIG. 2, the light source unit 1a-2 maybe disposed in a transmitting side apparatus in the front stage. For instance, with regard to the repeater amplifier 12a closest to the optical transmitter 11 on the transmission path, the light source unit 1a-2 and the frequency modulating circuit 2A may be disposed in the optical transmitter 11 in order to amplify signal light in the repeater amplifier 12a.

D Others

In the above second and third embodiments, description has been made, in detail, of the sweep control and the modulation control by the frequency sweep circuit 2 and the frequency modulating circuit 2A, respectively. According to this invention, a known pumping light variable controlling method may be applied so long as it can suppress generation of four-wave mixing at the same wavelength.

In each of the above embodiments, the pumping light PQ+1-PM has a plurality of wavelengths that are mixedly present in a band of the wavelength-multiplexed signal light S1-SN. According to this invention, at least one wavelength of the pumping light mixedly present in a band of the wavelength-multiplexed signal light S1-SN is sufficient. In such case, the similar advantages are provided like each of the embodiments.

In the first and third embodiments, a relationship between the pumping light P1-PQ outside a band of the signal light band and the pumping light PQ+1-PM inside the band of the signal light on the transmission path performing the Raman amplification is described by way of relationships shown in FIGS. 26C and 26D (denoted as P1-PQ, and PQ+1-PM in the drawings). However, the relationship in arrangement of the pumping sources may be as shown in FIG. 26A, 26B, 26E or 26I.

In the above first and third embodiments, the pumping light P1-PQ is used as counterpropagating pumping light and the pumping light PQ+1-PM is used as copropagating pumping light as shown by "○" in FIG. 26C, or the pumping light P1-PQ and the pumping light PQ+1-PM are used as counterpropagating pumping light as shown by "○" in FIG. 26D. Other than the above, both the pumping light P1-PQ and the pumping light PQ+1-PM may be used as copropagating pumping light as shown by "○" in FIG. 26A, or the pumping light P1-PQ may be used as copropagating pumping light and the pumping light PQ+1-PM may be used as counterpropagating pumping light as shown by "○" in FIG. 26B.

Further, the pumping light P1-PQ may be used as both copropagating and counterpropagating light and the pumping light PQ+1-PM may be used as copropagating pumping light as shown by "○" in FIG. 26E, or the pumping light P1-PQ may be used as both copropagating light and counterpropagating light and the pumping light PQ+1-PM may be used as counterpropagating light as shown by "○" in FIG. 26F, or the pumping light P1-PQ may be used as copropagating pumping light and the pumping light PQ+1-PM may be used as both copropagating light and counterpropagating pumping light as shown by "○" in FIG. 26G, or the pumping light P1-PQ may be used as counterpropagating pumping light and the pumping light PQ+1-PM may be used as both copropagating light and counterpropagating light as shown by "○" in FIG. 26H, or the pumping light P1-PQ and the pumping light PQ+1-PM may be used as both copropagating light and counterpropagating light as shown by "○" in FIG. 26I.

The present invention is not limited to the above examples, but may be modified in various ways without departing from the scope of the invention.

The Raman amplifier according to this invention can be manufactured as disclosed in each of the embodiments.

What is claimed is:

1. A Raman amplifier amplifying wavelength-multiplexed signal light, comprising:
    a light source unit generating pumping light to amplify the signal light, the signal light having a plurality of wavelengths within a wavelength band of the signal light, and the pumping light having a plurality of pumping light wavelengths within a wavelength band of the pumping light that overlaps a portion of the wavelength band of the signal light;
    a transmission path propagating the signal light and the pumping light from the light source unit, and amplifying the signal light;
    pumping light supplying means for supplying the pumping light to the transmission path; and
    filter means for narrowing a spread of a spectrum of the pumping light, generated by the light source unit, a portion of the pumping light being within the wavelength band of the signal light, and for outputting the pumping light to the pumping light supplying means, the filter means having a filter characteristic in a direction of wavelength where a peak of a transmission characteristic is located at a center wavelength, with respect to a spectrum of each wavelength of the pumping light, the wavelengths of the signal light being spaced further apart in the vicinity of a position at which a pumping light wavelength is located, and being equally spaced closer together for wavelengths of the signal light not in the vicinity of the position at which a pumping light wavelength is located.

2. The Raman amplifier according to claim 1, wherein the light source unit comprises
    a first pumping source generating first pumping light having a wavelength within the wavelength band of the signal light, and outputting the first pumping light to the filter means, and
    a second pumping source generating second pumping light having a wavelength outside the wavelength band of the signal light; and
    the pumping light supplying means comprises
        a multiplexer multiplexing the first pumping light, a spread of a spectrum of which has been narrowed by the filter means, and the second pumping light from the second pumping source, and
        first optical means for supplying pumping light multiplexed by the multiplexer as counterpropagating pumping light to the transmission path.

3. The Raman amplifier according to claim 1, wherein the light source unit comprises
    a first pumping source generating first pumping light having a wavelength within the wavelength band of the signal light, and outputting the first pumping light to the filter means, and
    a second pumping source generating second pumping light having a wavelength outside the wavelength band of the signal light; and
    the pumping light supplying means comprises
        second optical means for multiplexing the first pumping light, a spread of a spectrum of which has been narrowed by the filter means, as copropagating pumping light and the wavelength-multiplexed signal light, and
        third optical means for supplying the second pumping light generated by the second pumping source as counterpropagating pumping light to the transmission path.

4. A Raman amplifier amplifying wavelength-multiplexed signal light, comprising:
    a light source unit generating pumping light to amplify the signal light, the signal light having a plurality of wavelengths within a wavelength band of the signal light, and the pumping light having a plurality of pumping light wavelengths within a wavelength band of the pumping light that overlaps a portion of the wavelength band of the signal light;
    a transmission path;
    pumping light supplying means for supplying the pumping light to the transmission path, the transmission path propagating the signal light and the pumping light from the pumping light supplying means, and amplifying the signal light; and
    variable controlling means for variably controlling a wavelength of the pumping light generated by the light source unit, and for sweep-controlling by setting a sweep frequency of the pumping light to a frequency smaller than a mode spacing of the pumping light to suppress the generation of four-wave mixing light at the same wavelength.

5. The Raman amplifier according to claim 4, wherein the variable controlling means performs the sweep controlling or a modulation control on the wavelength of the pumping light.

6. The Raman amplifier according to claim 1, wherein the filter means narrows the spread of the spectrum of the pumping light to the same degree as a spread of the spectrum of the signal light.

7. The Raman amplifier according to claim 1, wherein the filter means comprises optical filters arranged in series in directions that cancel polarization dependency thereof.

8. The Raman amplifier according to claim 1, wherein the wavelengths of the pumping light overlapping the signal light are periodically arranged within the wavelength band of the signal light, and the filter means has a periodic filter characteristic corresponding to a wavelength spacing of the pumping light.

9. The Raman amplifier according to claim 5, wherein the frequency used to sweep control or modulate control the pumping light by the variable controlling means is set less than the mode spacing of the pumping light.

10. The Raman amplifier according to claim 1, wherein the wavelengths of the pumping light overlapping the signal light are arranged within the wavelength band of the signal light, and the wavelengths of the pumping light not overlapping the signal light are arranged outside the wavelength band of the signal light.

11. The Raman amplifier according to claim 4, wherein the wavelengths of the pumping light overlapping the signal light are arranged within the wavelength band of the signal light, and the wavelengths of the pumping light not overlapping the signal light are arranged outside the wavelength band of the signal light.

12. A Raman amplifier amplifying wavelength-multiplexed signal light, comprising:
   a light source unit generating pumping light to amplify the signal light, the signal light having a plurality of wavelengths within a wavelength band of the signal light, and the pumping light having a plurality of pumping light wavelengths within a wavelength band of the pumping light that overlaps a portion of the wavelength band of the signal light;
   a transmission path propagating the signal light and the pumping light from the light source unit, and amplifying the signal light;
   a pumping light supplying unit supplying the pumping light to the transmission path; and
   a filter narrowing a spread of a spectrum of the pumping light, generated by the light source unit, a portion of the pumping light being within the wavelength band of the signal light, and for outputting the pumping light to the pumping light supplying unit,
   the wavelengths of the signal light have a first spacing in a band shifted by a predetermined amount toward a longer wavelength side of a pumping light wavelength band, except a portion of the signal light wavelengths overlapping ones of the pumping light wavelengths, and
   the wavelengths of the signal light have a second spacing around a center of the ones of the pumping light wavelengths.

13. A Raman amplifier amplifying wavelength-multiplexed signal light, comprising:
   a light source unit generating pumping light to amplify the signal light, the signal light having a plurality of wavelengths within a wavelength band of the wavelength-multiplexed signal light;
   a transmission path propagating the signal light and the pumping light from the light source unit, and amplifying the signal light;
   a pumping light supplying unit supplying the pumping light to the transmission path; and
   a filter narrowing a spread of a spectrum of the pumping light, generated by the light source unit, a portion of the pumping light being within the wavelength band of the signal light, and for outputting the pumping light to the pumping light supplying unit,
   the filter narrowing the spread of the spectrum of the pumping light arranged within the wavelength band of the signal light to about the same degree as a spacing of each wavelength of the signal light, and having a filter characteristic in a direction of wavelength where a peak of a transmission characteristic is located at a center wavelength, with respect to a spectrum of each wavelength of the pumping light, the wavelengths of the signal light being spaced further apart in the vicinity of a position at which a pumping light wavelength is located, and being equally spaced closer together for wavelengths of the signal light not in the vicinity of the position at which a pumping light wavelength is located.

14. A Raman amplifier amplifying wavelength-multiplexed signal light, comprising:
   a light source unit generating pumping light to amplify the signal light, the signal light having a plurality of wavelengths within a wavelength band of the signal light, and the pumping light having a plurality of pumping light wavelengths within a wavelength band of the pumping light that overlaps a portion of the wavelength band of the signal light;
   a transmission path propagating the signal light and the pumping light from the light source unit, thereby amplifying the signal light;
   a pumping light supplying unit supplying the pumping light to the transmission path; and
   a filter narrowing a spread of a spectrum of the pumping light, generated by the light source unit, a portion of the pumping light being within the wavelength band of the signal light, and outputting the pumping light to the pumping light supplying unit, the filter having a filter characteristic in a direction of wavelength where a peak of a transmission characteristic is located at a center wavelength, with respect to a spectrum of each wavelength of the pumping light, the wavelengths of the signal light being spaced further apart in the vicinity of a position at which a pumping light wavelength is located, and being equally spaced closer together for wavelengths of the signal light not in the vicinity of the position at which a pumping light wavelength is located.

15. The Raman amplifier according to claim 14, further comprising:
   a variable controlling unit variably controlling a wavelength of the pumping light generated by the light source unit, and sweep-controlling by setting a sweep frequency of the pumping light to a frequency smaller than a mode spacing of the pumping light to suppress the generation of four-wave mixing light at the same wavelength.

16. An apparatus comprising:
   a light source unit generating pumping light, the pumping light being provided to a transmission path so that a signal light is Raman amplified as the signal light travels through the transmission path, the signal light being a wavelength division multiplexed signal light having a plurality of wavelengths within a wavelength band of the signal light, and the pumping light having a plurality of pumping light wavelengths within a wavelength band of the pumping light that overlaps a portion of the wavelength band of the signal light; and a controller sweep-controlling by setting a sweep frequency of the pumping light to a frequency smaller than a mode spacing of the pumping light to suppress the generation of four-wave mixing light, the wavelengths of the signal light being spaced further apart in the vicinity of a position at which a pumping light wavelength is located, and being equally spaced closer together for wavelengths of the signal light not in the vicinity of the position at which a pumping light wavelength is located.

17. An apparatus comprising:

a light source unit generating pumping light, the pumping light being provided to a transmission path so that a signal light is Raman amplified as the signal light travels through the transmission path, the signal light being a wavelength division multiplexed signal light having a plurality of wavelengths within a wavelength band of the signal light, and the pumping light having a plurality of pumping light wavelengths within a wavelength band of the pumping light that overlaps a portion of the wavelength band of the signal light; and means for sweep-controlling by setting a sweep frequency of the pumping light to a frequency smaller than a mode spacing of the pumping light to suppress the generation of four-wave mixing light, the wavelengths of the signal light being spaced further apart in the vicinity of a position at which a pumping light wavelength is located, and being equally spaced closer together for wavelengths of the signal light not in the vicinity of the position at which a pumping light wavelength is located.

18. The Raman amplifier according to claim 12, further comprising:

a variable controlling unit variably controlling a wavelength of the pumping light generated by the light source unit, and sweep-controlling by setting a sweep frequency of the pumping light to a frequency smaller than a mode spacing of the pumping light to suppress the generation of four-wave mixing light at the same wavelength.

* * * * *

UNITED STATES PATENT AND TRADEMARK OFFICE
CERTIFICATE OF CORRECTION

PATENT NO. : 6,954,304 B2
DATED : October 11, 2005
INVENTOR(S) : Toshiki Tanaka et al.

It is certified that error appears in the above-identified patent and that said Letters Patent is hereby corrected as shown below:

<u>Title page,</u>
Item [56], References Cited, OTHER PUBLICATIONS,
"Shu Namiki et al." reference, change "DivisionMultiplexed" to
-- Division-Multiplexed --.

Signed and Sealed this

Seventh Day of February, 2006

JON W. DUDAS
*Director of the United States Patent and Trademark Office*